(12) United States Patent
Jiang et al.

(10) Patent No.: US 11,393,999 B2
(45) Date of Patent: Jul. 19, 2022

(54) DISPLAY SUBSTRATE WITH NANO-GROOVES AND METHOD FOR MANUFACTURING SAME, AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Ni Jiang, Beijing (CN); Xiaohui Wu, Beijing (CN)

(73) Assignees: Chengdu BOE Optoelectronics Technology Co., Ltd., Sichuan Province (CN); BOE Technology Group Co., Ltd., Beijing (CN)

( * ) Notice: Subject to any disclaimer, the term of this patent is extended or adjusted under 35 U.S.C. 154(b) by 167 days.

(21) Appl. No.: 16/556,329

(22) Filed: Aug. 30, 2019

(65) Prior Publication Data
US 2020/0075878 A1    Mar. 5, 2020

(30) Foreign Application Priority Data
Aug. 31, 2018 (CN) .......................... 201811016561.5

(51) Int. Cl.
*H01L 51/50* (2006.01)
*H01L 51/00* (2006.01)
(Continued)

(52) U.S. Cl.
CPC ...... *H01L 51/5064* (2013.01); *H01L 51/0014* (2013.01); *H01L 51/0097* (2013.01);
(Continued)

(58) Field of Classification Search
CPC ............. H01L 51/5064; H01L 51/0097; H01L 51/5012; H01L 51/508; H01L 27/3244
(Continued)

(56) References Cited

U.S. PATENT DOCUMENTS

2002/0104995 A1* 8/2002 Yamazaki ........... H01L 27/1255
257/72
2005/0231106 A1* 10/2005 Tanaka ................ H01L 51/5268
313/506
(Continued)

FOREIGN PATENT DOCUMENTS

CN         103219476 A       7/2013
CN         103460797 A      12/2013
(Continued)

OTHER PUBLICATIONS

First office action of Chinese application No. 201811016561.5 dated Apr. 29, 2020.

*Primary Examiner* — Xia L Cross
(74) *Attorney, Agent, or Firm* — Fay Sharpe LLP

(57) ABSTRACT

The present disclosure discloses a display substrate and a manufacturing method thereof, a display panel, and a display apparatus. The display substrate comprises: a base substrate, and display units on the base substrate; each of the display units comprises: an anode, a hole transporting layer, an electroluminescent layer, an electron transporting layer and a cathode, all of which are superposed in sequence; a plurality of nano-grooves are disposed on a surface of at least one of the hole transporting layer and the electron transporting layer, the surface is in contact with the electroluminescent layer; and a distance between any two adjacent nano-grooves is on a nanometric order of magnitude. The present disclosure is useful in improving the capability of the display units in resisting bending and preventing the display units from being ruptured due to a bending process.

15 Claims, 18 Drawing Sheets

(51) Int. Cl.
*H01L 27/32* (2006.01)
*H01L 51/52* (2006.01)

(52) U.S. Cl.
CPC ........ *H01L 51/508* (2013.01); *H01L 51/5012* (2013.01); *H01L 51/5056* (2013.01); *H01L 51/5072* (2013.01); *H01L 27/3244* (2013.01); *H01L 51/0037* (2013.01); *H01L 51/5246* (2013.01); *H01L 2227/323* (2013.01); *H01L 2251/5338* (2013.01)

(58) Field of Classification Search
USPC .......................................................... 428/690
See application file for complete search history.

(56) References Cited

U.S. PATENT DOCUMENTS

| | | | |
|---|---|---|---|
| 2010/0176717 A1* | 7/2010 | Lee | H01L 51/5271 313/504 |
| 2014/0001450 A1* | 1/2014 | Shinotsuka | H01L 51/5275 257/40 |
| 2016/0087234 A1 | 3/2016 | Song et al. | |
| 2016/0155787 A1* | 6/2016 | Lee | H01L 27/3258 257/72 |
| 2017/0301887 A1 | 10/2017 | Shinotsuka et al. | |
| 2019/0259976 A1* | 8/2019 | Kishimoto | H01L 51/56 |

FOREIGN PATENT DOCUMENTS

| | | |
|---|---|---|
| CN | 103474586 A | 12/2013 |
| CN | 105594007 A | 5/2016 |
| CN | 107104200 A | 8/2017 |
| CN | 107611272 A | 1/2018 |

\* cited by examiner

DISPLAY SUBSTRATE WITH NANO-GROOVES AND METHOD FOR MANUFACTURING SAME, AND DISPLAY PANEL

CROSS-REFERENCE TO RELATED APPLICATION

This application claims priority to Chinese Patent Application No.: 201811016561.5, filed on Aug. 31, 2018 and entitled "DISPLAY SUBSTRATES AND METHODS FOR MANUFACTURING SAME, DISPLAY PANELS AND DISPLAY APPARATUSES", the contents of which are incorporated herein by reference in their entirety.

TECHNICAL FIELD

The present disclosure relates to display substrates and methods for manufacturing same, display panels and display apparatuses.

BACKGROUND

An organic light-emitting diode (OLED) display apparatus has the advantages of low power consumption, self-illumination, wide viewing angle, full color, fast response and the like, and is one of the research hotspots in the current display field. Compared with the conventional display apparatus, the OLED display apparatus may also have the characteristics of flexibility when displaying, which provides infinite possibilities for the implementation of smart wearable devices.

SUMMARY

The present disclosure provides display substrates and method for manufacturing same, display panels and display apparatuses. The present disclosure has the following technical solutions.

In one aspect, there is provided a display substrate, including:

a base substrate, and display units on the base substrate, wherein each of the display units includes: an anode, a hole transporting layer, an electroluminescent layer, an electron transporting layer and a cathode, all of which are superposed in sequence; a plurality of nano-grooves are disposed on a surface of at least one of the hole transporting layer and the electron transporting layer, the surface is in contact with the electroluminescent layer; and a distance between any two adjacent nano-grooves is on a nanometric order of magnitude.

In some embodiments, the nano-grooves are hemispherical nano-grooves.

In some embodiments, the nano-grooves have a depth in a range of 3 to 40 nm, and the distance between any two adjacent nano-grooves is in a range of 5 to 50 nm.

In some embodiments, the hole transporting layer has a plurality of the nano-grooves on a surface that is in contact with the electroluminescent layer, and a maximum thickness of the hole transporting layer is in a range of 10 to 50 nm.

In some embodiments, the display units are located in a display region of the base substrate, the base substrate further has a non-display region, and the display substrate further includes:

a display stress releasing layer located in the non-display region, wherein the display stress releasing layer has a plurality of nano-grooves on a surface that is away from the base substrate, and a distance between any two adjacent nano-grooves on the display stress releasing layer is on a nanometric order of magnitude.

In some embodiments, each of the hole transporting layers has a plurality of the nano-grooves on a surface that is in contact with the electroluminescent layer, and a maximum thickness of the display stress releasing layer is equal to the maximum thickness of each of the hole transporting layers.

In some embodiments, a material of both the display stress releasing layer and the hole transporting layers is poly(3,4-ethylenedioxythiophene):poly(styrenesulfonate) (PEDOT:PSS for short).

In some embodiments, the display substrate further includes:

gate lines and data lines on the base substrate, wherein the display units further include thin film transistors, each of which includes a gate, a source and a drain; the gate is electrically connected to a gate line; the source is electrically connected to a data line; and the drain is electrically connected to an anode.

In another aspect, there is provided a method for manufacturing a display substrate, including:

providing a base substrate;

forming display units on the base substrate, wherein each of the display units includes: an anode, a hole transporting layer, an electroluminescent layer, an electron transporting layer and a cathode, all of which are superposed in sequence; a plurality of nano-grooves are disposed on a surface of at least one of the hole transporting layer and the electron transporting layer; the surface is in contact with the electroluminescent layer; and a distance between any two adjacent nano-grooves is on a nanometric order of magnitude.

In some embodiments, the nano-grooves are hemispherical nano-grooves.

In some embodiments, the nano-grooves have a depth in a range of 3 to 40 nm, and the distance between any two adjacent nano-grooves is in a range of 5 to 50 nm.

In some embodiments, a plurality of the nano-grooves are disposed on a surface of the hole transporting layer that is in contact with the electroluminescent layer, and a maximum thickness of the hole transporting layer is in a range of 10 to 50 nm.

In some embodiments, the forming display units on the base substrate includes:

forming the anodes on the base substrate;

forming the hole transporting layers on the base substrate on which the anodes have been formed, each of the hole transporting layers having a plurality of nano-grooves on a surface that is away from the anode, and a distance between any two adjacent nano-grooves on each of the hole transporting layers being on a nanometric order of magnitude; and forming the electroluminescent layers, the electron transporting layers, and the cathodes on the base substrate on which the hole transporting layers have been formed.

In some embodiments, the forming the hole transporting layers on the base substrate on which the anodes have been formed, each of the hole transporting layers having a plurality of nano-grooves on a surface that is away from the anode, and a distance between any two adjacent nano-grooves on each of the hole transporting layers being on a nanometric order of magnitude, includes:

forming a polystyrene monolayer film on the base substrate on which the anodes have been formed, the polystyrene monolayer film including a plurality of polystyrene spheres, and a distance between any two adjacent polystyrene spheres being on a nanometric order of magnitude;

forming a poly(3,4-ethylenedioxythiophene):poly(styrenesulfonate) layer on the base substrate on which the polystyrene monolayer film has been formed, so that the polystyrene spheres in the polystyrene monolayer film float on a surface of the poly(3,4-ethylenedioxythiophene):poly(styrenesulfonate) layer;

drying the poly(3,4-ethylenedioxythiophene):poly(styrenesulfonate) layer;

washing the surface of the dried poly(3,4-ethylenedioxythiophene):poly(styrenesulfonate) layer to remove the polystyrene spheres on the surface of the poly(3,4-ethylenedioxythiophene):poly(styrenesulfonate) layer, thereby forming a plurality of nano-grooves on a surface of the poly(3,4-ethylenedioxythiophene):poly(styrenesulfonate) layer away from the anode; and treating the washed poly(3,4-ethylenedioxythiophene):poly(styrenesulfonate) layer with a primary patterning process to obtain the hole transporting layer.

In some embodiments, the washing the surface of the dried poly(3,4-ethylenedioxythiophene):poly(styrenesulfonate) layer includes: washing the surface of the dried poly(3,4-ethylenedioxythiophene):poly(styrenesulfonate) layer with toluene.

In some embodiments, the display units are located in a display region of the base substrate, the base substrate further has a non-display region, and the method further includes:

forming a display stress releasing layer in the non-display region, wherein the display stress releasing layer has a plurality of nano-grooves on a surface away from the base substrate, and a distance between any two adjacent nano-grooves on the display stress releasing layer is on a nanometric order of magnitude.

In some embodiments, the display stress releasing layer and the hole transporting layers are formed by the same primary process.

In some embodiments, a plurality of the nano-grooves are disposed on a surface of each of the hole transporting layers that is in contact with the electroluminescent layer, and a maximum thickness of the display stress releasing layer is equal to the maximum thickness of each of the hole transporting layers.

In some embodiments, a material of both the display stress releasing layer and the hole transporting layers is poly(3,4-ethylenedioxythiophene):poly(styrenesulfonate).

In some embodiments, before forming the anodes on the base substrate, the method further includes: forming gate lines, data lines and thin film transistors on the base substrate, wherein each of the thin film transistors includes a gate, a source and a drain; the gate is electrically connected to a gate line; and the source is electrically connected to a data line; and the forming the anodes on the base substrate includes: forming the anodes on the base substrate on which the gate lines, the data lines and the thin film transistors have been formed, wherein each anode is electrically connected to a drain.

In yet another aspect, there is provided a display panel, including:

a display substrate and a package substrate located in an opposite position, wherein the display substrate includes a base substrate and display units on the base substrate; each of the display units includes: an anode, a hole transporting layer, an electroluminescent layer, an electron transporting layer and a cathode, all of which are superposed in sequence; a plurality of nano-grooves are disposed on a surface of at least one of the hole transporting layer and the electron transporting layer, the surface is in contact with the electroluminescent layer; and a distance between any two adjacent nano-grooves is on a nanometric order of magnitude.

In some embodiments, the nano-grooves are hemispherical nano-grooves.

In some embodiments, the nano-grooves have a depth in a range of 3 to 40 nm, and the distance between any two adjacent nano-grooves is in a range of 5 to 50 nm.

In some embodiments, a plurality of the nano-grooves are disposed on a surface of the hole transporting layer that is in contact with the electroluminescent layer, and a maximum thickness of the hole transporting layer is in a range of 10 to 50 nm.

In some embodiments, the display units are located in the display region of the base substrate; the base substrate further has a non-display region; and the display substrate further includes: a display stress releasing layer located in the non-display region, the display stress releasing layer having a plurality of nano-grooves on a surface that is away from the base substrate, and a distance between any two adjacent nano-grooves on the display stress releasing layer is on a nanometric order of magnitude.

In some embodiments, a plurality of the nano-grooves are disposed on a surface of each of the hole transporting layers that is in contact with the electroluminescent layer, and a maximum thickness of the display stress releasing layer is equal to the maximum thickness of each of the hole transporting layers.

In some embodiments, a material of both the display stress releasing layer and the hole transporting layers is poly(3,4-ethylenedioxythiophene):poly(styrenesulfonate).

In some embodiments, the display substrate further includes:

gate lines and data lines on the base substrate, wherein the display units further include thin film transistors, each of which includes a gate, a source and a drain; the gate is electrically connected to a gate line; the source is electrically connected to a data line; and the drain is electrically connected to an anode.

In some embodiments, the display panel further includes:

a package stress releasing layer in the non-display region of the package substrate, wherein the package stress releasing layer has a plurality of nano-grooves on a surface that is away from the package substrate; a distance between any two adjacent nano-grooves on the package stress releasing layer is on a nanometric order of magnitude; and the package stress releasing layer is located between the display substrate and the package substrate.

In a further aspect, there is provided a method for manufacturing a display panel, including:

forming the display substrate according to the above aspects or any optional manner of the above aspects;

forming a package stress releasing layer in a non-display region of a package substrate, the package stress releasing layer having a plurality of nano-grooves on a surface away from the package substrate, and a distance between any two adjacent nano-grooves on the package stress releasing layer being on a nanometric order of magnitude; and disposing the display substrate and the package substrate in an opposite position so that the package stress releasing layer is located between the display substrate and the package substrate.

In a further another aspect, there is provided a display apparatus, which includes the display panel according to the above yet another aspect or any optional manner of the above yet another aspect.

BRIEF DESCRIPTION OF THE DRAWINGS

In order to describe the technical solutions in the aspects of the present disclosure more clearly, a brief introduction of the accompanying drawings required for describing the embodiments is presented in the following. Apparently, the accompanying drawings as described in the following show merely some embodiments of the present disclosure, and a person of ordinary skill in the art can further obtain other drawings from these accompanying drawings without creative efforts.

Figure 1:
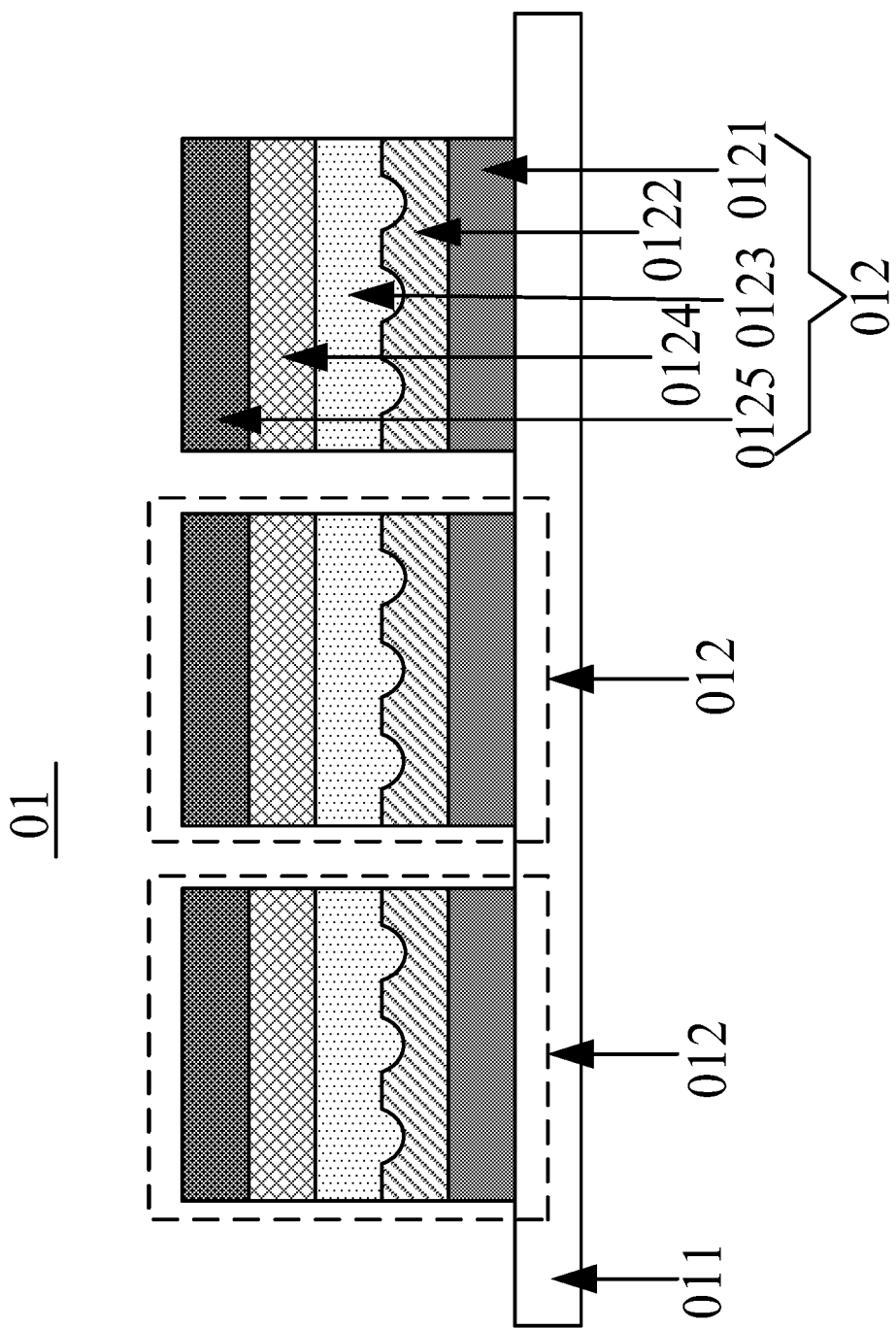
FIG. 1 is a schematic structural diagram of a display substrate according to some embodiments of the present disclosure.

These drawings are incorporated into and constitute a portion of the specification for the purposes of illustrating the embodiments in line with the present disclosure and explaining the principles of the present disclosure together with the specification.

DETAILED DESCRIPTION

In order to make the objects, technical solutions and advantages of the present disclosure more clearly, the technical solutions of the present disclosure will be further described below in detail in conjunction with the accompanying drawings. Apparently, merely some but not all of the embodiments of the present disclosure are described. Based on the embodiments of the present disclosure, all the other embodiments obtained by those of ordinary skills in the art without making inventive efforts shall fall within the protection scope of the present disclosure.

An OLED display apparatus includes an OLED display substrate, which includes a base substrate, a plurality of gate lines and a plurality of data lines on the base substrate, and a plurality of display units arranged on the base substrate in an array. The plurality of gate lines and the plurality of data lines are mutually crossed to define a plurality of pixel regions, each of which is defined by two adjacent gate lines and two adjacent data lines; and each of the display units is located within one pixel region and includes an anode, a hole transporting layer, an electroluminescent layer, an electron transporting layer and a cathode that are superposed sequentially along a direction away from the base substrate. Under the action of a voltage difference between the anode and the cathode, holes in the anode are injected into the electroluminescent layer through the hole transporting layer, electrons in the cathode are injected into the electroluminescent layer through the electron transporting layer, and the holes and the electrons are recombined in the electroluminescent layer to generate energy, exciting the electroluminescent layer to emit light.

However, the gate lines, the data lines, and the display units have only limited capability in resisting bending. When an OLED display apparatus is applied to a flexible display product such as a smart wearable device, the gate lines, the data lines, and the display units are easy to break during bending, thereby limiting the development of the OLED display apparatus in the field of smart wearable devices.

According to the display substrates and the manufacturing methods thereof, the display panels, and the display apparatuses provided by the embodiments of the present disclosure, in each display unit of the display substrate, a plurality of nano-grooves are disposed on a surface of at least one of the hole transporting layer and the electron transporting layer, the surface is in contact with the electroluminescent layer; and a distance between any two adjacent nano-grooves is on a nanometric order of magnitude. The nano-grooves on each of the transporting layers can increase the contact area between each of the transporting layers and the electroluminescent layer, and improve the capability in resisting bending of the display units, preventing the display units from being ruptured due to the bending process.

In some embodiments, the display substrate further has a display stress releasing layer, the surface of which has a plurality of nano-grooves, and a distance between any two adjacent nano-grooves on the display stress releasing layer is on a nanometric order of magnitude. The nano-grooves on the display stress releasing layer can increase the contact area between the display substrate and a glass cement (an adhesive disposed between the display substrate and the package substrate for adhering them together), and improve the capability of structures such as the gate lines and the data lines in resisting bending, thereby preventing the gate lines and the data lines from being broken due to the bending process. Further detailed descriptions of the present disclosure could refer to the following embodiments.

A reference will be made to FIG. 1, which illustrates a schematic structural diagram showing a display substrate 01 according to some embodiments of the present disclosure. Referring to FIG. 1, the display substrate 01 may include: a base substrate 011, and a display unit 012 located on the base substrate 011; the display unit 012 includes: anode 0121, a hole transporting layer 0122, an electroluminescent layer 0123, an electron transporting layer 0124 and cathode 0125, and these components are superposed in sequence; at least one of the hole transporting layer 0122 and a plurality of nano-grooves (not shown in FIG. 1) are disposed on a surface of the electron transporting layer 0124 that is in contact with the electroluminescent layer 0123; and a distance between any two adjacent nano-grooves on at least one of the hole transporting layer 0122 and the electron transporting layer 0124 is on a nanometric order of magnitude. In some embodiments of the present disclosure shown in FIG. 1, as an example, a plurality of nano-grooves are disposed on a surface of each of the hole transporting layers 0122 that is in contact with the electroluminescent layer 0123. In this case, in the display substrate 01 shown in FIG. 1, a distance between any two adjacent nano-grooves on the hole transporting layer 0122 may be on a nanometric order of magnitude.

In summary, in the display substrates provided by some embodiments of the present disclosure, since a plurality of nano-grooves are disposed on a surface of at least one of the hole transporting layer and the electron transporting layer, the surface is in contact with the electroluminescent layer, and a distance between any two adjacent nano-grooves is on a nanometric order of magnitude, more but smaller nano-grooves are present on at least one of the hole transporting layer and the electron transporting layer, which can increase the contact area between at least one of the hole transporting layer and the electron transporting layer and the electroluminescent layer, so that at least one of the hole transporting layer and the electron transporting layer may absorb and release the stresses of the electroluminescent layers to a greater extent, contributing to the improvement of the capability in resisting bending of the display units, and preventing the display units from being ruptured due to the bending process.

Figure 2:
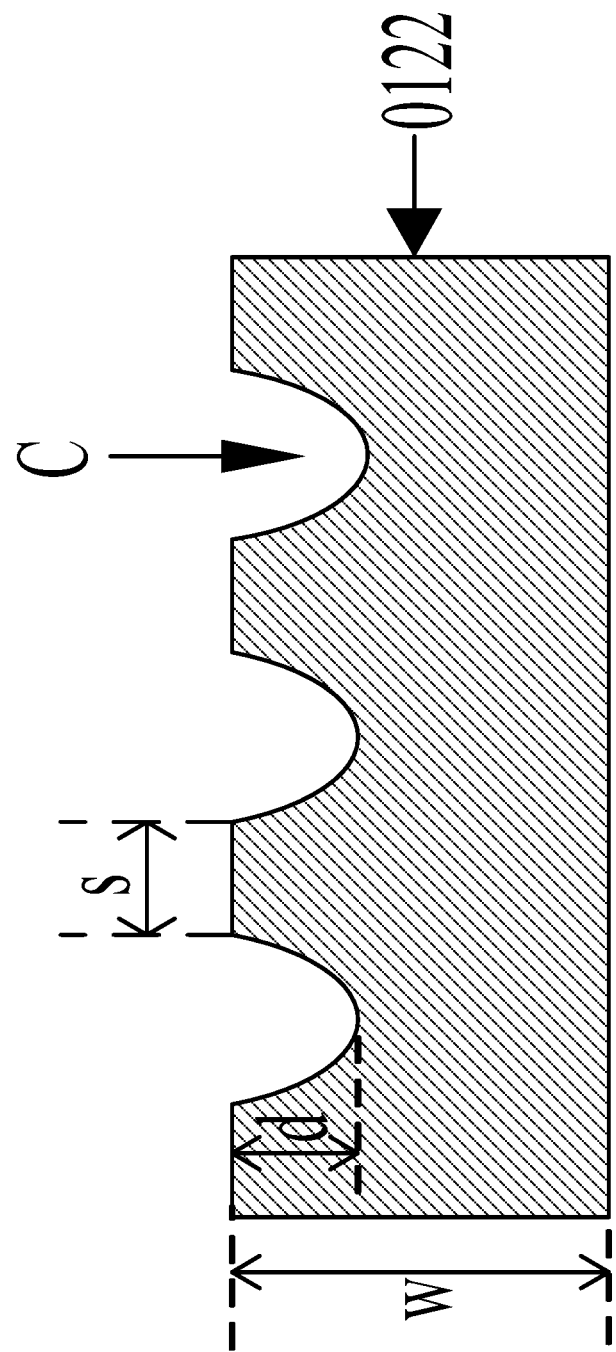
FIG. 2 is a schematic structural diagram of a hole transporting layer according to some embodiments of the present disclosure.

In some embodiments, as shown in FIG. 1, the display substrate 01 includes a plurality of display units 012 (three units are shown in FIG. 1), each of which includes an anode 0121, a hole transporting layer 0122, an electroluminescent layer 0123, an electron transporting layer 0124, and a cathode 0125, all of which are superposed in sequence along the direction away from the base substrate 011. All the display units 012 may have the same structure in the display substrate 01. FIG. 2 is a schematic structural diagram of a hole transporting layer 0122 according to some embodiments of the present disclosure. As shown in FIG. 2, the surface of the hole transporting layer 0122 has a plurality of nano-grooves C, each of which may be a hemispherical nano-groove and may have a depth d in a range of 3 to 40 nm (nanometers), and a distance s between any two adjacent nano-grooves C in the plurality of nano-grooves C may be in a range of 5 to 50 nm. In some embodiments of the present disclosure, the bottom surface of each of the nano-grooves C may be a curved surface, and the depth d of each of the nano-grooves C refers to the maximum distance between an opening surface and a bottom surface of the nano-groove C. Furthermore, each of the nano-grooves C has a certain dimension, different positional points of two adjacent nano-grooves C have varied distances, thus the distance s between two adjacent nano-grooves C refers to the minimum distance between the two adjacent nano-grooves C. It will be readily understood by persons of ordinary skill in the art that some embodiments of the present disclosure are described by taking the hemispherical nano-grooves as an example, and the nano-grooves may have any shapes, which is not limited in the embodiments of the present disclosure. In some embodiments, as shown in FIG. 2, the maximum thickness w of the hole transporting layer 0122 may be in a range of 10 to 50 nm, and may be determined based on the luminescence property required by the display substrate 01. By way of example, the hole transporting layer 0122 may have a maximum thickness of 40 nm.

Figure 3:
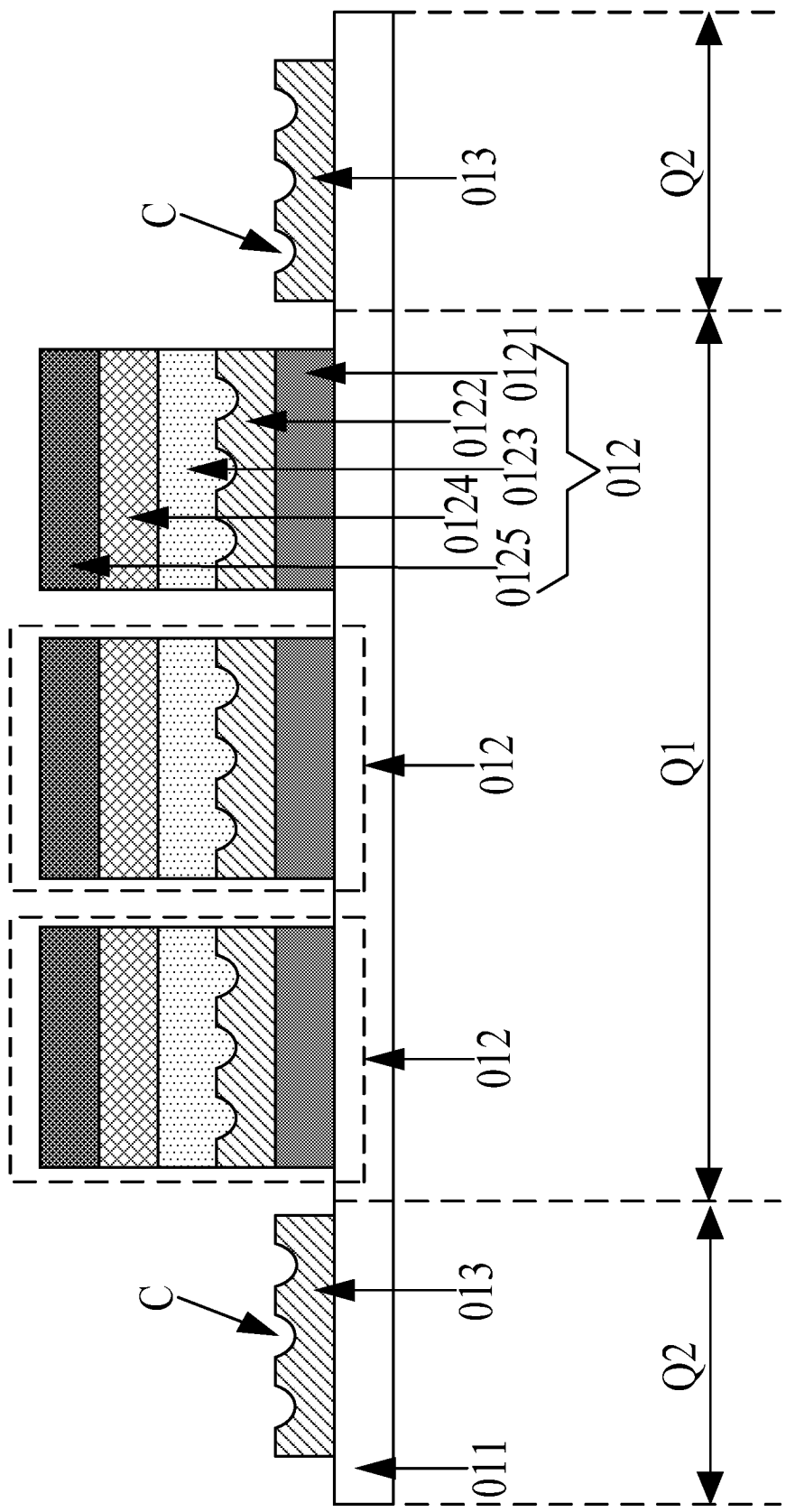
FIG. 3 is a schematic structural diagram of another display substrate according to some embodiments of the present disclosure.

In some embodiments, a reference will be made to FIG. 3, which illustrates a schematic structural diagram of another display substrate 01 according to some embodiments of the present disclosure. Referring to FIG. 3, the base substrate 011 has a display region Q1 and a non-display region Q2, the non-display region Q2 surrounds the display region Q1, and the plurality of display units 012 are located in the display region Q1. The display substrate 01 further includes: display stress releasing layers 013 located in the non-display region Q2, wherein the display stress releasing layers 013 have a plurality of nano-grooves C on a surface that is away from the base substrate 011, and a distance between any two adjacent nano-grooves C on the display stress releasing layers is on a nanometric order of magnitude. Here, the display stress releasing layer 013 and the hole transporting layer 0122 may have the same structure and the same maximum thickness, and may also be made from the same material. For example, the material of both the display stress releasing layer 013 and the hole transporting layer 0122 may be poly(3,4-ethylenedioxythiophene):poly(styrenesulfonate) and the display stress releasing layer 013 and the hole transporting layer 0122 may be formed by the same primary process.

In some embodiments of the present disclosure, the base substrate 011 may be a transparent substrate, which may be a rigid substrate made from a light-guiding non-metallic material with a robustness, such as glass, quartz, transparent resin or the like. Alternatively, the base substrate 011 may be a flexible substrate made from polyimide (PI for short). When the base substrate 011 is a flexible substrate, the display substrate 01 is a flexible display substrate.

In some embodiments of the present disclosure, the display substrate 01 may further include a plurality of gate lines (not shown in FIG. 1 or FIG. 3) and a plurality of data lines (not shown in FIG. 1 or FIG. 3) on the base substrate 011. The plurality of gate lines and the plurality of data lines define a plurality of pixel regions (not shown in FIG. 1 or FIG. 3), each of which is defined by two adjacent gate lines and two adjacent data lines. The plurality of display units 012 are located in the plurality of pixel regions in one-to-one correspondence. Each of the display units 012 includes: an anode 0121, a hole transporting layer 0122, an electroluminescent layer 0123, an electron transporting layer 0124, and a cathode 0125, and all these structures are superposed in sequence along a direction away from the base substrate. Each of the display units 0122 may further include a thin film transistor (TFT for short) (not shown in FIG. 1 or FIG. 3) between the anode 0121 and the base substrate 011. The TFT may include a gate, a gate insulating layer, an active layer, and a source-drain layer, wherein the source-drain layer may include a source and a drain; the gate of the TFT may be electrically connected to the gate line; the source may be electrically connected to the data line; the drain may be electrically connected to the corresponding anode 0121; and each TFT acts as a switch of the corresponding display unit 012 for controlling the ON or OFF of the corresponding display unit 012. Furthermore, the display substrate 01 may further include a package structure (not shown in FIG. 1 or FIG. 3) on the display unit 012. The package structure may be a thin film package structure for packaging the display unit 012, so as to prevent the air, oxygen or other air component from eroding the electroluminescent layer 0123 of the display unit 012.

It will be readily understood by persons of ordinary skill in the art that in some embodiments of the present disclosure, each of the hole transporting layers 0122 has a plurality of nano-grooves, which contributes to better stability and mechanical properties. The hole transporting layers 0122 serves as a support for the display unit 012 in which the hole transporting layer 0122 is located. Compared with hole transporting layers having no nano-grooves, the hole transporting layers 0122 having the nano-grooves according to the embodiments of the present disclosure can increase the contact area between the hole transporting layer 0122 and the electroluminescent layer 0123 by 1.5 times. The hole transporting layer 0122 may absorb and release the stress of the electroluminescent layer 0123 to a greater extent and improve the capability in resisting bending of the electroluminescent layer 0123, thereby improving the capability of the display unit 012 and the display substrate 01 in resisting bending. Furthermore, under the condition that the non-display region of the base substrate 011 has a display stress releasing layer 013 with nano-grooves, the display stress releasing layer 013 may disperse the tension of the non-display region of the base substrate 011, thereby improving the capability in resisting bending of the structures such as the gate lines and the data lines in the non-display region of the base substrate 011.

The poly(3,4-ethylenedioxythiophene):poly(styrene-sulfonate) has high thermal stability and may be used to form the hole transporting layer. In some embodiments of the present disclosure, poly(3,4-ethylenedioxythiophene):poly(styrenesulfonate) is used to form the hole transporting layer 0122, leading to a small interfacial potential barrier between the hole transporting layers 0122 and the anode 0121, so that holes in the anode 0121 could more easily enter the hole transporting layer 0122 and reach the electroluminescent layer 0123 through the hole transporting layer 0122 to recombine with electrons, thereby contributing to an improvement in the luminous efficiency of the electroluminescent layer 0123. Furthermore, by performing X-ray diffraction analysis on the hole transporting layer 0122, it can be seen that as compared with the hole transporting layer without nano-grooves, the hole transporting layer 0122 made from poly(3,4-ethylenedioxythiophene):poly(styrenesulfonate) and having the nano-grooves has a surface that is higher in crystallinity. Therefore, with a higher crystallinity of the surface of the hole transporting layer 0122, the work function of the hole transporting layer 0122 is increased, so that the work function of the hole transporting layer 0122 is closer to the work function of the electroluminescent layer 0123, and the valence band of the hole transporting layer 0122 and the electroluminescent layer 0123 are more matched. In addition, the interfacial potential barrier between the hole transporting layer 0122 and the electroluminescent layer 0123 is reduced, so that the hole transporting efficiency of the hole transporting layer 0122 may be increased by 2.5 times, thereby improving the luminescent efficiency of the electroluminescent layer 0123.

It will be readily understood by persons of ordinary skill in the art that the embodiments of the present disclosure in which the hole transporting layer 0122 has nano-grooves thereon are only described as an example. Electron transporting layers 0124 may have the same nano-grooves as the hole transporting layers 0122, and the details of which are not repeated in the present disclosure. Furthermore, in some embodiments of the present disclosure, the electroluminescent layer 0123 may be any film layer that emits light when driven by electricity. For example, the electroluminescent layer 0123 may be an organic luminescent layer or a quantum dot luminescent layer or the like, which is not limited in the embodiments of the present disclosure.

In summary, in the display substrates provided by some embodiments of the present disclosure, since a plurality of nano-grooves are disposed on a surface of at least one of the hole transporting layer and the electron transporting layer, the surface is in contact with the electroluminescent layer, and a distance between any two adjacent nano-grooves is on a nanometric order of magnitude, more but smaller nano-grooves are present on at least one of the hole transporting layer and the electron transporting layer, which can increase the contact area between at least one of the hole transporting layer and the electron transporting layer and the electroluminescent layer, so that at least one of the hole transporting layer and the electron transporting layer may absorb and release the stresses of the electroluminescent layers to a greater extent, contributing to the improvement of the capability in resisting bending of the display units, and preventing the display units from being ruptured due to the bending process. Furthermore, since the non-display region of the base substrate is provided with the display stress releasing layer having a plurality of nano-grooves, with the distance between any two adjacent nano-grooves on the display stress releasing layer being on a nanometric order of magnitude, more but smaller nano-grooves are present on the display stress releasing layer, which can increase the contact area between the display stress releasing layer and the glass cement, and improve the capability of the structures such as the gate lines and the data lines in the non-display region in resisting bending, thereby preventing the gate lines and the data lines from being ruptured due to the bending process.

The display substrates provided by some embodiments of the present disclosure can be applied to the method below. The method and principle for manufacturing the display substrates in some embodiments of the present disclosure can be explained by referring to the following descriptions.

Figure 4:
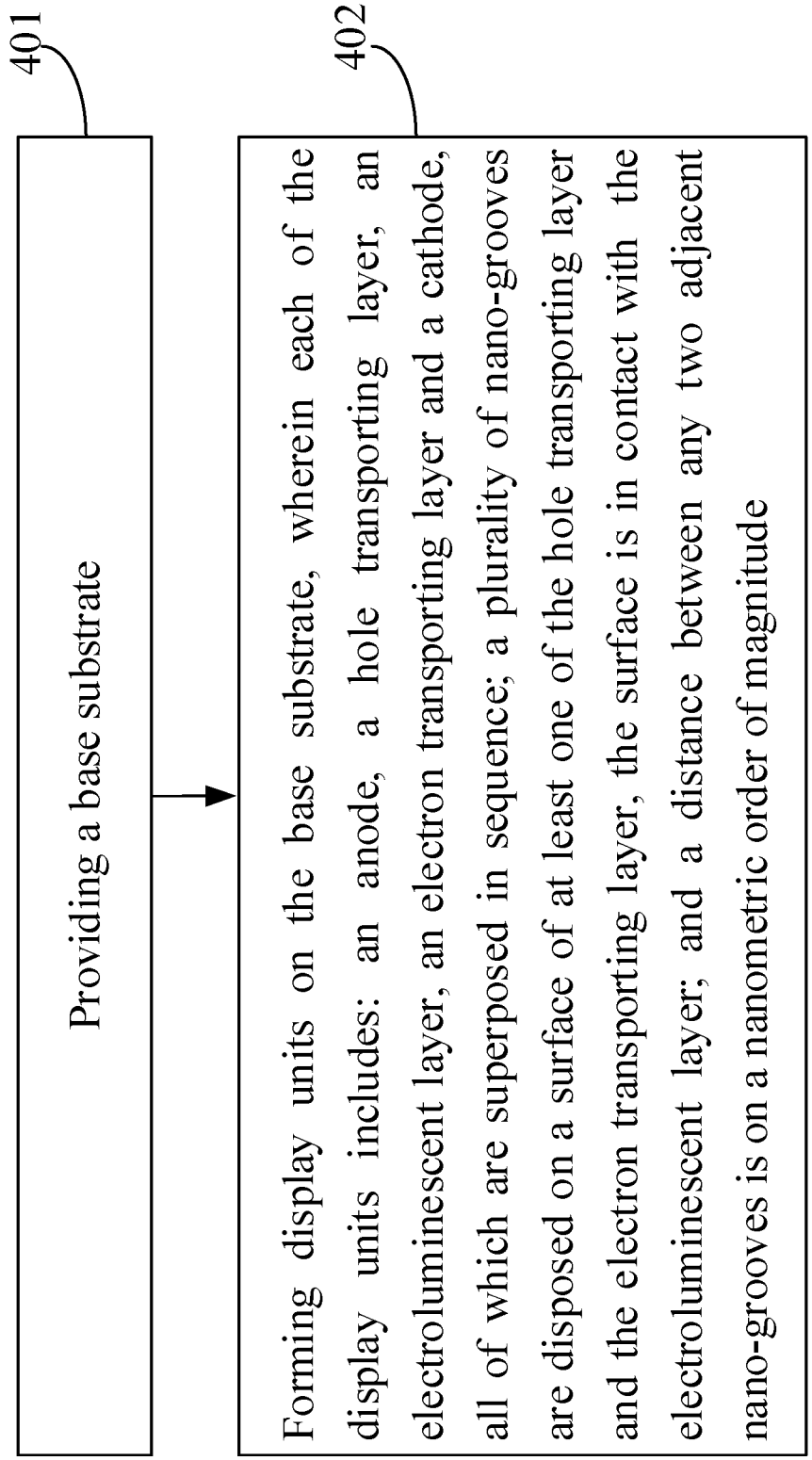
FIG. 4 is a flowchart of a method for manufacturing a display substrate according to some embodiments of the present disclosure.

A reference will be made to FIG. 4, which illustrates a flowchart of a method for manufacturing display substrates according to some embodiments of the present disclosure. The method for manufacturing the display substrates may be used to manufacture the display substrate 01 shown in FIG. 1 or FIG. 3 Referring to FIG. 4, the method may include the following steps.

In Step 401, a base substrate is provided.

In Step 402, display units are formed on the base substrate, wherein each of the display units includes: an anode, a hole transporting layer, an electroluminescent layer, an electron transporting layer and a cathode, all of which are superposed in sequence; a plurality of nano-grooves are disposed on a surface of at least one of the hole transporting layer and the electron transporting layer, the surface is in contact with the electroluminescent layer; and a distance between any two adjacent nano-grooves is on a nanometric order of magnitude.

In summary, in the method for manufacturing the display substrates provided by some embodiments of the present disclosure, since a plurality of nano-grooves are disposed on a surface of at least one of the hole transporting layer and the electron transporting layer, the surface is in contact with the electroluminescent layer, and a distance between any two adjacent nano-grooves is on a nanometric order of magnitude, more but smaller nano-grooves are present on the at least one of the hole transporting layer and the electron transporting layer, which can increase the contact area between the at least one of the hole transporting layer and the electron transporting layer and the electroluminescent layer, so that the at least one of the hole transporting layer and the electron transporting layer may absorb and release the stresses of the electroluminescent layers to a greater extent, contributing to the improvement of the capability in resisting bending of the display units, and preventing the display units from being ruptured due to the bending process.

In some embodiments, the nano-grooves are hemispherical nano-grooves.

In some embodiments, the depth of the nano-grooves is in a range of 3 to 40 nm, and the distance between any two adjacent nano-grooves is in a range of 5 to 50 nm.

In some embodiments, a plurality of nano-grooves are disposed on a surface of the hole transporting layer that is in contact with the electroluminescent layer, and a maximum thickness of the hole transporting layer is in a range of 10 to 50 nm.

In some embodiments, Step 402 may include:

forming anodes on the base substrate;

forming hole transporting layers on the base substrate on which the anodes have been formed, each of the hole transporting layers having a plurality of nano-grooves on a surface that is away from the anodes, and a distance between any two adjacent nano-grooves on each of the hole transporting layers being on a nanometric order of magnitude; and forming electroluminescent layers, electron transporting layers, and cathodes on the base substrate on which the hole transporting layers have been formed.

In some embodiments, the forming hole transporting layers on the base substrate on which the anodes have been formed, each of the hole transporting layers having a plurality of nano-grooves on a surface that is away from the anode, and a distance between any two adjacent nano-grooves on each of the hole transporting layers being on a nanometric order of magnitude, includes:

forming a polystyrene monolayer film on the base substrate on which the anodes have been formed, the polystyrene monolayer film including a plurality of polystyrene spheres, and a distance between any two adjacent polystyrene spheres being on a nanometric order of magnitude;

forming a poly(3,4-ethylenedioxythiophene):poly(styrenesulfonate) layer on the base substrate on which the polystyrene monolayer film has been formed, so that the polystyrene spheres in the polystyrene monolayer film float on a surface of the poly(3,4-ethylenedioxythiophene):poly(styrenesulfonate) layer;

drying the poly(3,4-ethylenedioxythiophene):poly(styrenesulfonate) layer;

washing the surface of the dried poly(3,4-ethylenedioxythiophene):poly(styrenesulfonate) layer to remove the polystyrene spheres on the surface of the poly(3,4-ethylenedioxythiophene):poly(styrenesulfonate) layer, and forming a plurality of nano-grooves on a surface of the poly(3,4-ethylenedioxythiophene):poly(styrenesulfonate) layer away from the anodes; and treating the washed poly(3,4-ethylenedioxythiophene):poly(styrenesulfonate) layer with a primary patterning process to obtain the hole transporting layer.

In some embodiments, the washing the surface of the dried poly(3,4-ethylenedioxythiophene):poly(styrenesulfonate) layer includes: washing the surface of the dried poly(3,4-ethylenedioxythiophene):poly(styrenesulfonate) layer with toluene.

In some embodiments, the display unit is located in a display region of the base substrate, the base substrate further has a non-display region, and the method may further include:

forming a display stress releasing layer in the non-display region, the display stress releasing layer having a plurality of nano-grooves on a surface away from the base substrate, and a distance between any two adjacent nano-grooves on the display stress releasing layer being on a nanometric order of magnitude.

In some embodiments, the display stress releasing layer and the hole transporting layer are formed by the same primary process.

In some embodiments, a plurality of the nano-grooves are disposed on a surface of the hole transporting layer that is in contact with the electroluminescent layer, and a maximum thickness of the display stress releasing layer is equal to the maximum thickness of the hole transporting layer.

In some embodiments, a material of both the display stress releasing layer and the hole transporting layer is poly(3,4-ethylenedioxythiophene):poly(styrenesulfonate).

In some embodiments, before forming the anodes on the base substrate, the method further includes: forming gate lines, data lines and thin film transistors on the base substrate, wherein each of the thin film transistors includes a gate, a source and a drain; the gate is electrically connected to a gate line; and the source is electrically connected to a data line.

Accordingly, forming the anodes on the base substrate may include: forming the anodes on the base substrate on which the gate lines, the data lines and the thin film transistors have been formed, wherein the anodes are electrically connected to the drains.

All the above optional technical solutions could be combined in any manner to form alternative embodiments of the present disclosure, and the details are not repeated here.

Figure 5:
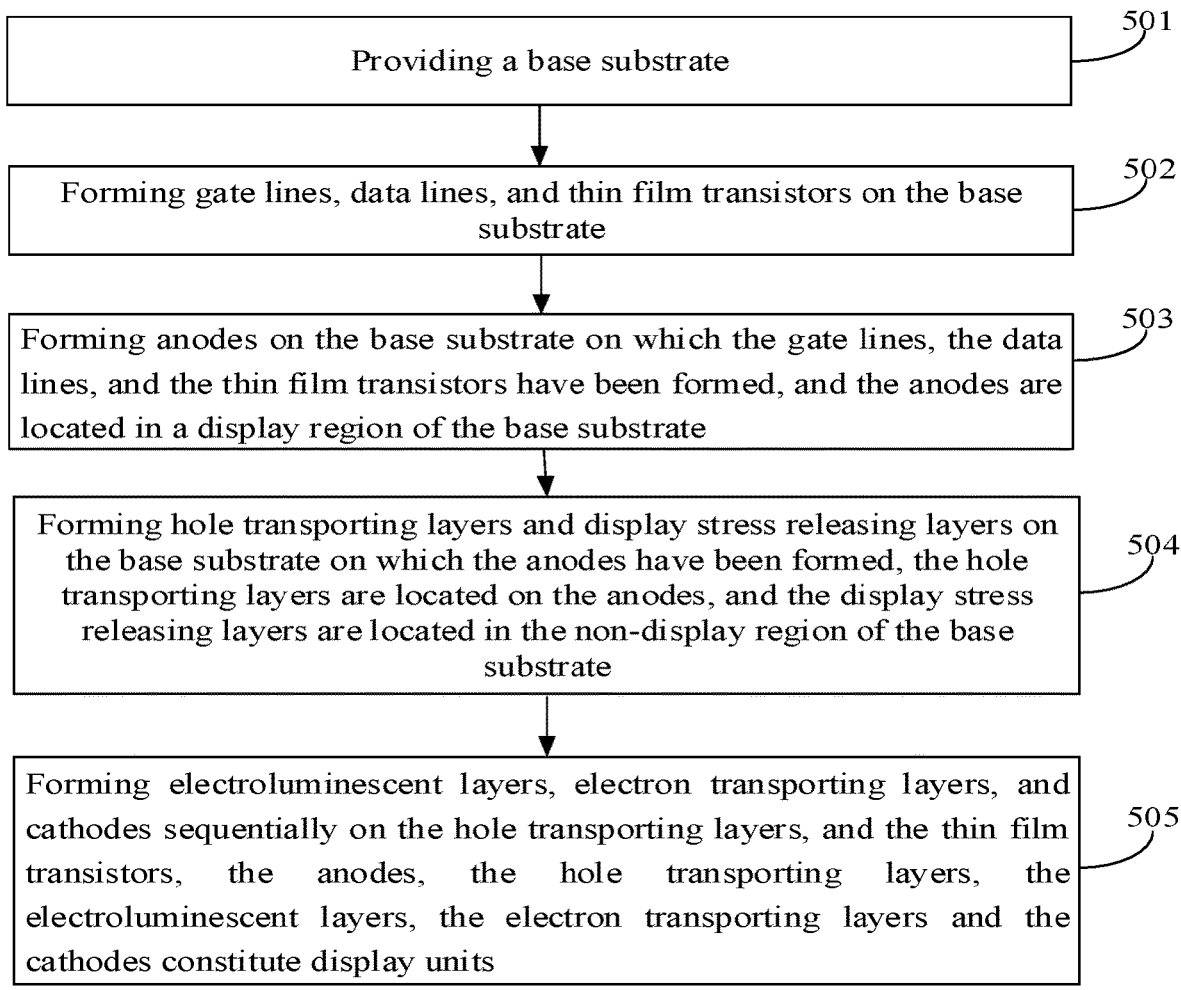
FIG. 5 is a flowchart of another method for manufacturing a display substrate according to some embodiments of the present disclosure.

Referring to FIG. 5, a flowchart of another method for manufacturing display substrates according to some embodiments of the present disclosure is shown. The method for manufacturing the display substrates may be used in manufacturing the display substrate 01 shown in FIG. 1 or FIG. 3. These embodiments will be illustrated by taking the display substrate 01 shown in FIG. 3 as an example. Referring to FIG. 5, the method may include the following steps.

In Step 501, a base substrate is provided.

Here, the base substrate may be a transparent substrate, which may be a rigid substrate made from a light-guiding non-metallic material with a robustness, such as glass, quartz, transparent resin or the like. Alternatively, the base substrate may be a flexible substrate made from PI.

In step 502, gate lines, data lines, and thin film transistors are formed on the base substrate.

Among them, each of the thin film transistors may include a gate, a gate insulating layer, an active layer, and a source-drain layer, wherein the source-drain layer may include a source and a drain; the source and the drain are respectively in contact with the active layer; the gate, the gate insulating layer, the active layer and the source-drain layer may be arranged in sequence along a direction away from the base substrate; the gate may be electrically connected to the gate line, and may be located at the same layer as the gate line; and the data line may be electrically connected to the source, and may be located on the same layer as the source-drain layer.

In some embodiments, forming the gate lines, the data lines, and the thin film transistors on the base substrate may include: first, forming a gate material layer on the base substrate, and treating the gate material layer by a primary patterning process to obtain the gates and the gate lines; then, depositing an insulating material as a gate insulating layer on the base substrate on which the gates and the gate lines have been formed; then, forming a semiconductor material layer on the base substrate on which the gate insulating layer has been formed, and treating the semiconductor material layer by the primary patterning process to obtain an active layer; and finally, forming a metal material layer on the base substrate on which the active layer has been formed, and treating the metal material layer by a primary patterning process to obtain the data lines, sources and drains.

In step 503, anodes are formed on the base substrate on which the gate lines, the data lines, and the thin film transistors have been formed, and are located in a display region of the base substrate.

Figure 6:
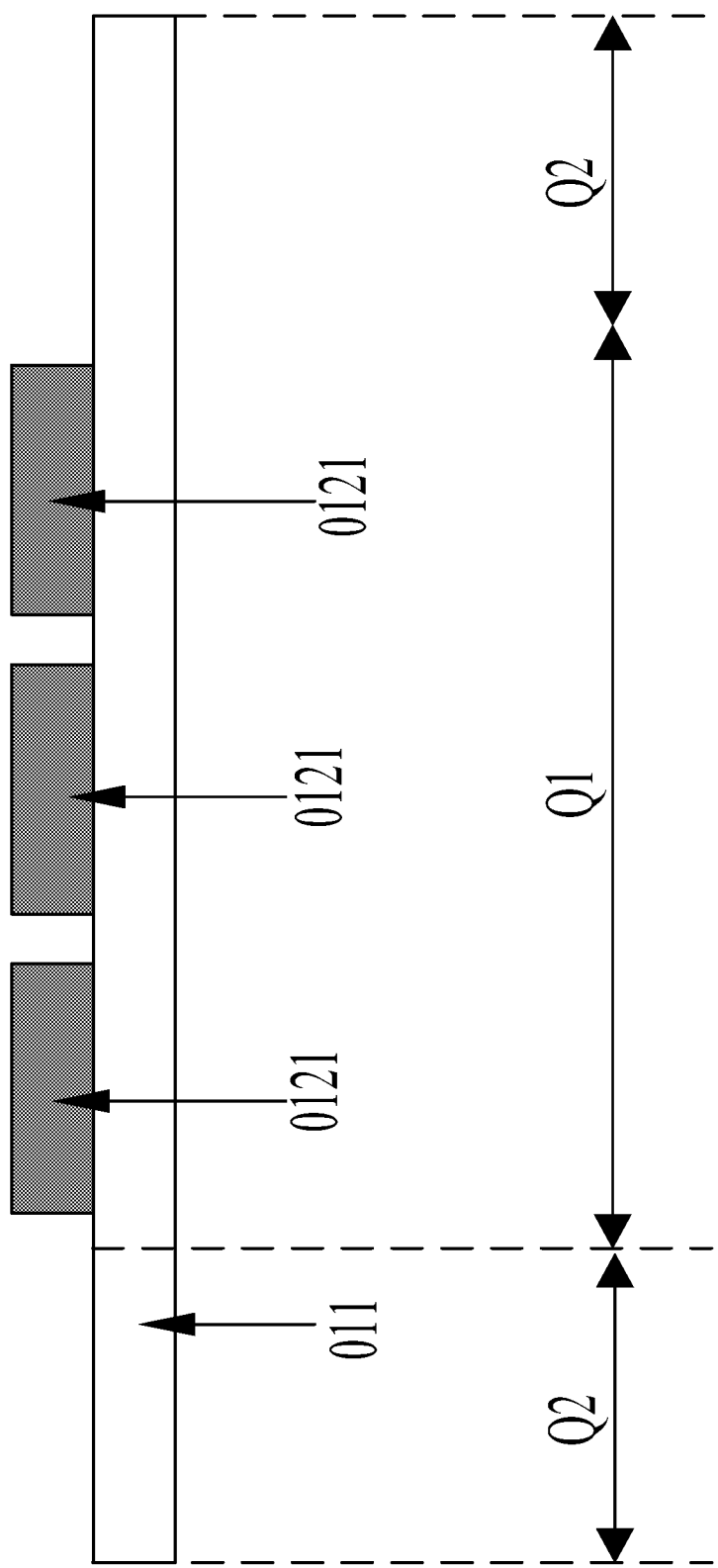
FIG. 6 is a schematic diagram showing a base substrate on which anodes have been formed according to some embodiments of the present disclosure.

A reference will be made to FIG. 6, which illustrates a schematic diagram showing a base substrate 011 on which the gate lines, the data lines, and the thin film transistors have been formed (the gate lines, the data lines and the thin film transistors are not shown in FIG. 6), after being further provided with anodes 0121 thereon according to some embodiments of the present disclosure. As shown in FIG. 6, the base substrate 011 has a display region Q1 and a non-display region Q2; the non-display region Q2 surrounds the display region Q1; and in the display region Q1, there are a plurality of anodes 0121, which may be made from materials such as indium tin oxide (ITO for short) or indium zinc oxide (IZO for short) or other transparent semiconductor oxides.

Taking ITO as the material of anodes 0121 as an example, on the base substrate 011 on which the gate lines, data lines and thin film transistors have been formed, a layer of ITO may be deposited by any of processes such as magnetron sputtering, thermal evaporation, or plasma enhanced chemical vapor deposition (PECVD for short) to obtain an ITO material layer, which is then treated by a primary patterning process to obtain the anodes 0121.

In step 504, hole transporting layers and display stress releasing layers are formed on the base substrate on which the anodes have been formed. The hole transporting layers are located on the anodes, and the display stress releasing layer are located in the non-display region of the base substrate.

Figure 7:
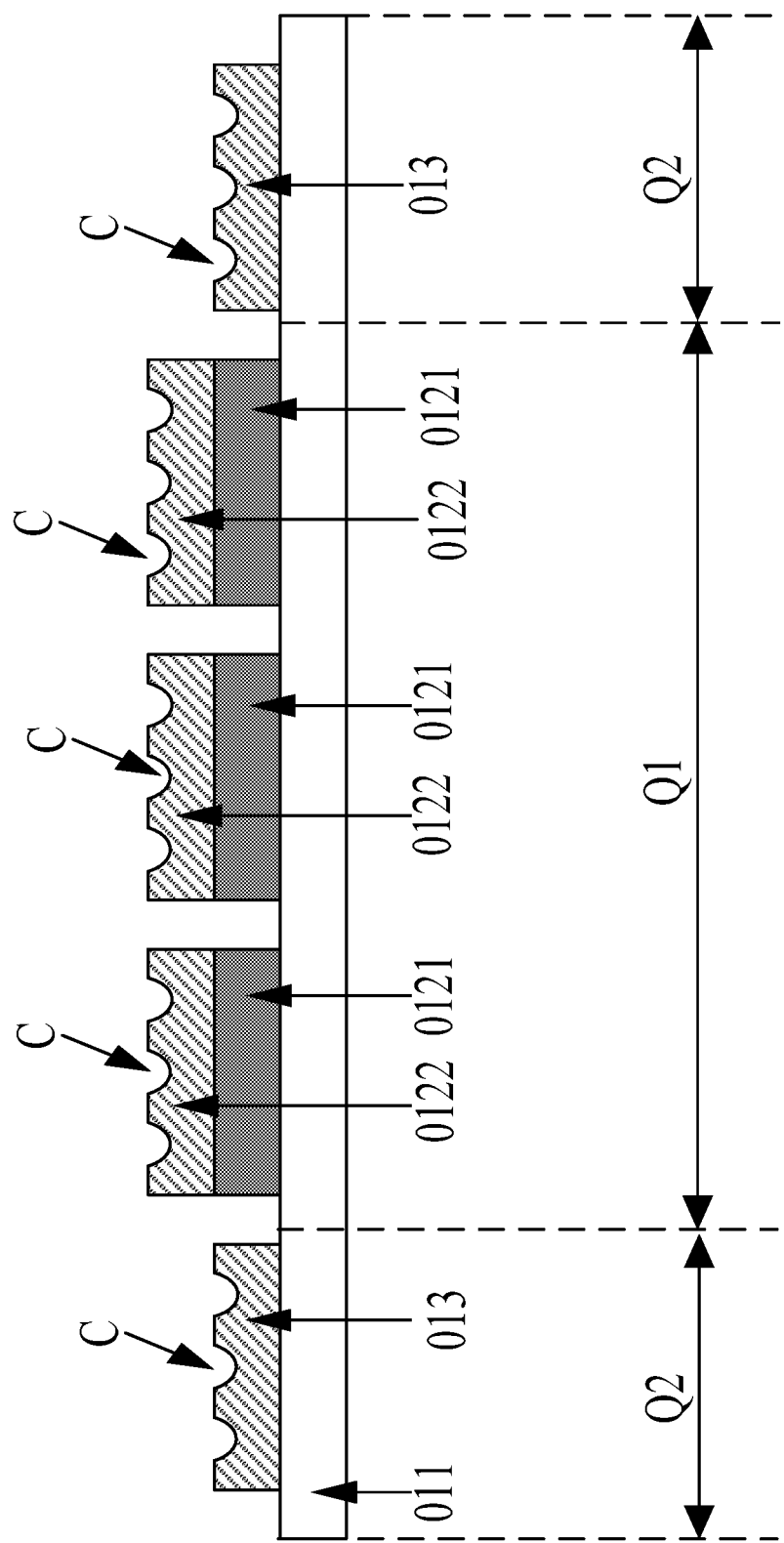
FIG. 7 is a schematic diagram showing a base substrate on which anodes have been formed, after being provided with hole transporting layers and display stress releasing layers thereon according to some embodiments of the present disclosure.

A reference will be made to FIG. 7, which illustrates a schematic diagram of a base substrate 011 on which the anodes 0121 have been formed, after hole transporting layers 0122 and display stress releasing layers 013 being further formed thereon according to some embodiments of the present disclosure. As shown in FIG. 7, each of the anodes 0121 has a hole transporting layer 0122, and the display stress releasing layer 013 is located in the non-display region Q2 of the base substrate 011. In some embodiments of the present disclosure, the display stress releasing layer 013 and the hole transporting layer 0122 may be formed by the same primary process, and may be made from the same material of poly(3,4-ethylenedioxythiophene):poly(styrenesulfonate); and the surface of the hole transporting layer 0122 away from the anodes 0121 and the surface of the display stress releasing layer 013 away from the base substrate 011 both have a plurality of nano-grooves C, each of which is a hemispherical nano-groove, and has a depth d in a range of 3 to 40 nm. A distance between any two adjacent nano-grooves C on the hole transporting layer 0122 may be in a range of 5 to 50 nm, and a distance between any two adjacent nano-grooves C on the display stress releasing layer 013 may be in a range of 5 to 50 nm. The maximum thickness of the hole transporting layer 0122 may be in a range of 10 to 50 nm; the maximum thickness of the display stress releasing layer 013 may be in a range of 10 to 50 nm; and the maximum thickness of the hole transporting layer 0122 may be equal to the maximum thickness of the display stress releasing layer 013. Here, the maximum thickness of the hole transporting layer 0122 may be determined according to the luminescence property that the display substrate needs to have.

Figure 8:
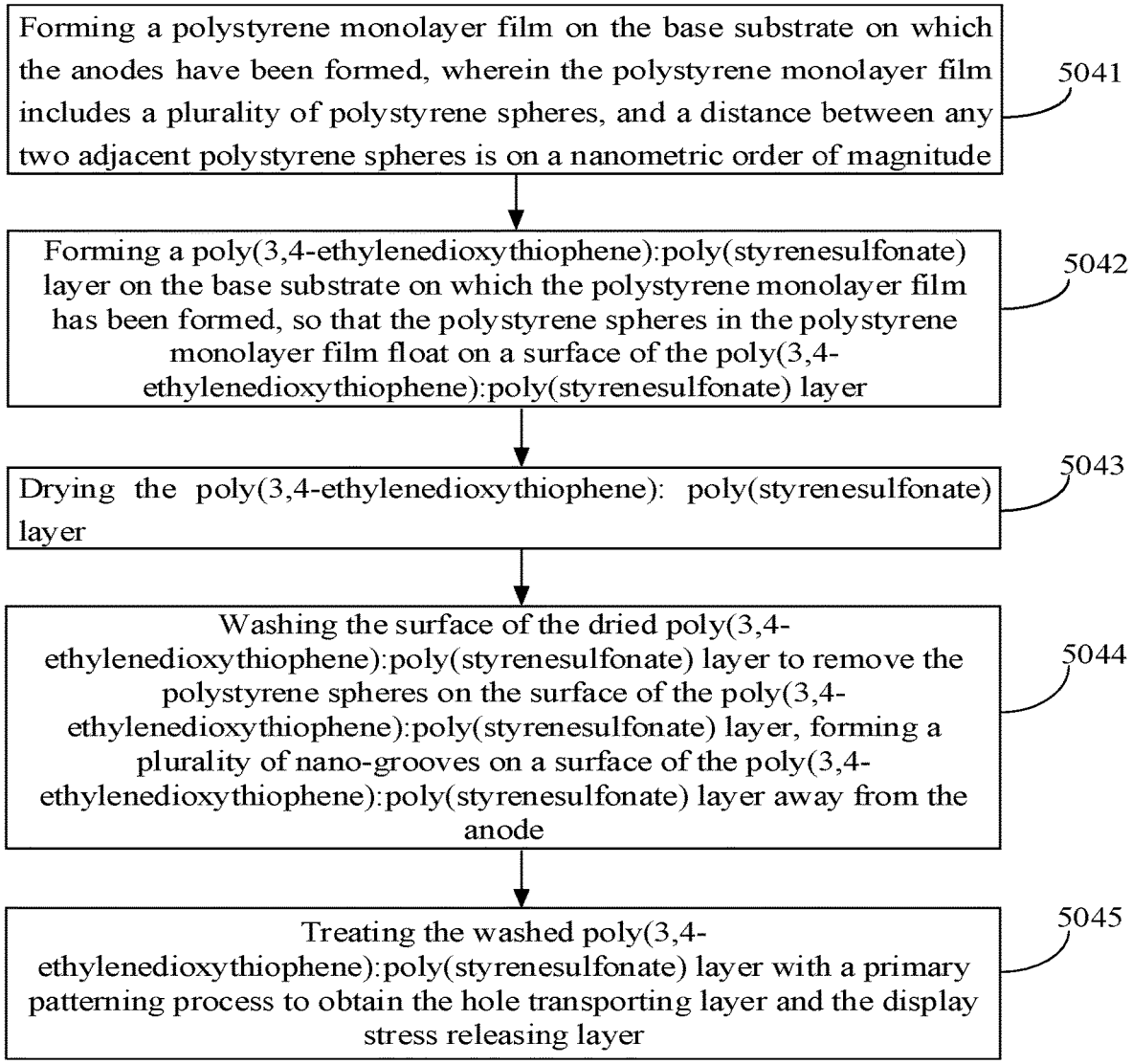
FIG. 8 is a flowchart of a method for forming hole transporting layers and display stress releasing layers on a base substrate on which anodes have been formed according to some embodiments of the present disclosure.

In some embodiments, a reference will be made to FIG. 8, which illustrates a flowchart of a method for forming hole transporting layers and display stress releasing layers on a base substrate on which anodes have been formed according to some embodiments of the present disclosure. Referring to FIG. 8, the method may include the following steps.

In Sub-step 5041, a polystyrene monolayer film is formed on the base substrate on which the anodes have been formed, wherein the polystyrene monolayer film includes a plurality of polystyrene spheres, and a distance between any two adjacent polystyrene spheres is on a nanometric order of magnitude.

Figure 9:
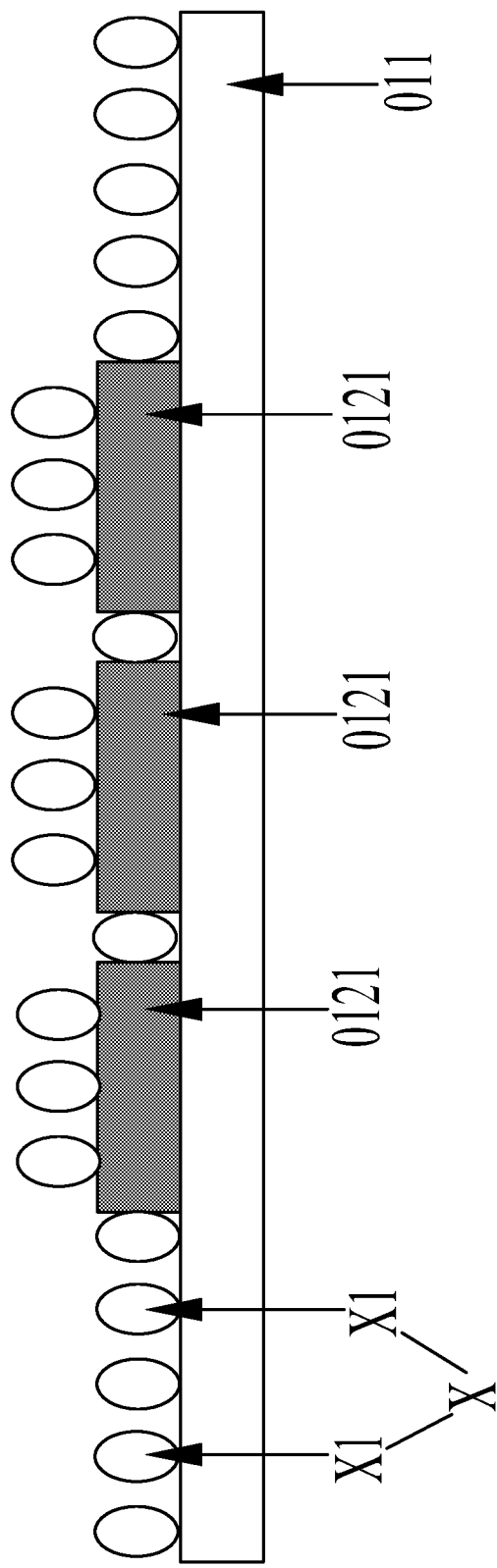
FIG. 9 is a schematic diagram showing a base substrate, on which anodes have been formed, after being provided with a polystyrene monolayer film thereon according to some embodiments of the present disclosure.
Figure 10:
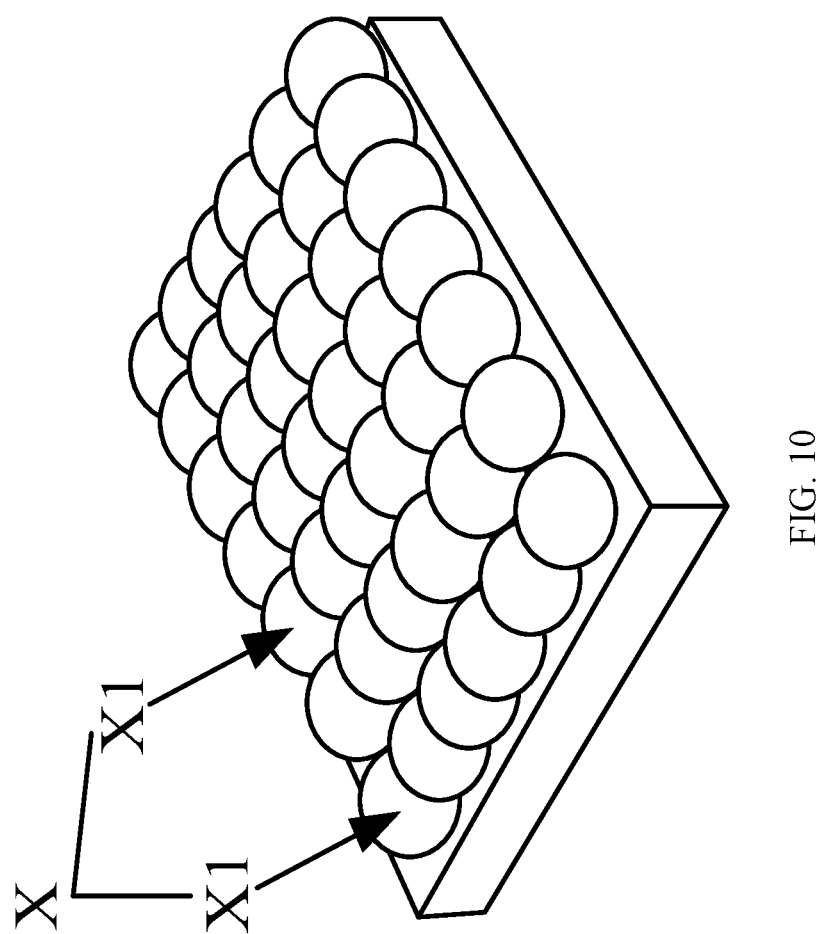
FIG. 10 is a schematic perspective diagram showing a base substrate, on which anodes have been formed, after being provided with a polystyrene monolayer film thereon according to some embodiments of the present disclosure.

FIG. 9 is a schematic diagram showing the base substrate 011 on which the anodes 0121 have been formed, after being further provided with a polystyrene monolayer film X thereon according to some embodiments of the present disclosure, and FIG. 10 is a schematic perspective diagram showing the base substrate 011, on which the anodes 0121 have been formed, after being further provided with a polystyrene monolayer film X thereon according to some embodiments of the present disclosure. Referring to FIG. 9 and FIG. 10, the polystyrene monolayer film X includes a plurality of polystyrene spheres X1, each of which may be a polystyrene microsphere having a nano-scale diameter; a distance between any two adjacent polystyrene spheres X1 of the plurality of polystyrene spheres X1 is on a nanometric order of magnitude; the thickness of the polystyrene monolayer film X may be in a range of 5 to 50 nm, and may be determined according to the maximum thickness of the hole transporting layer required to be formed subsequently, in order to ensure the interfacial fitness between the hole transporting layer formed subsequently and the electroluminescent layer, and the flexibility of the resulting display substrate. Here, the polystyrene monolayer film X may be a polystyrene sphere layer, which includes a layer of polystyrene microspheres constituted by polystyrene; and the thickness of the polystyrene monolayer film X is also the diameter of the polystyrene microspheres. In some embodiments of the present disclosure, a polystyrene layer constituted from the polystyrene microspheres may be coated on the base substrate 011 on which the anodes 0121 have been formed through a coating process, to obtain the polystyrene monolayer film X. It will be readily understood by persons of ordinary skill in the art that the polystyrene including polystyrene microspheres is a currently available material, and the embodiments of the present disclosure do not make a limitation on a method for forming the polystyrene including polystyrene microspheres.

In Sub-step 5042, a poly(3,4-ethylenedioxythiophene):poly(styrenesulfonate) layer is formed on the base substrate on which the polystyrene monolayer film has been formed, so that the polystyrene spheres in the polystyrene monolayer film float on a surface of the poly(3,4-ethylenedioxythiophene):poly(styrenesulfonate) layer.

Figure 11:
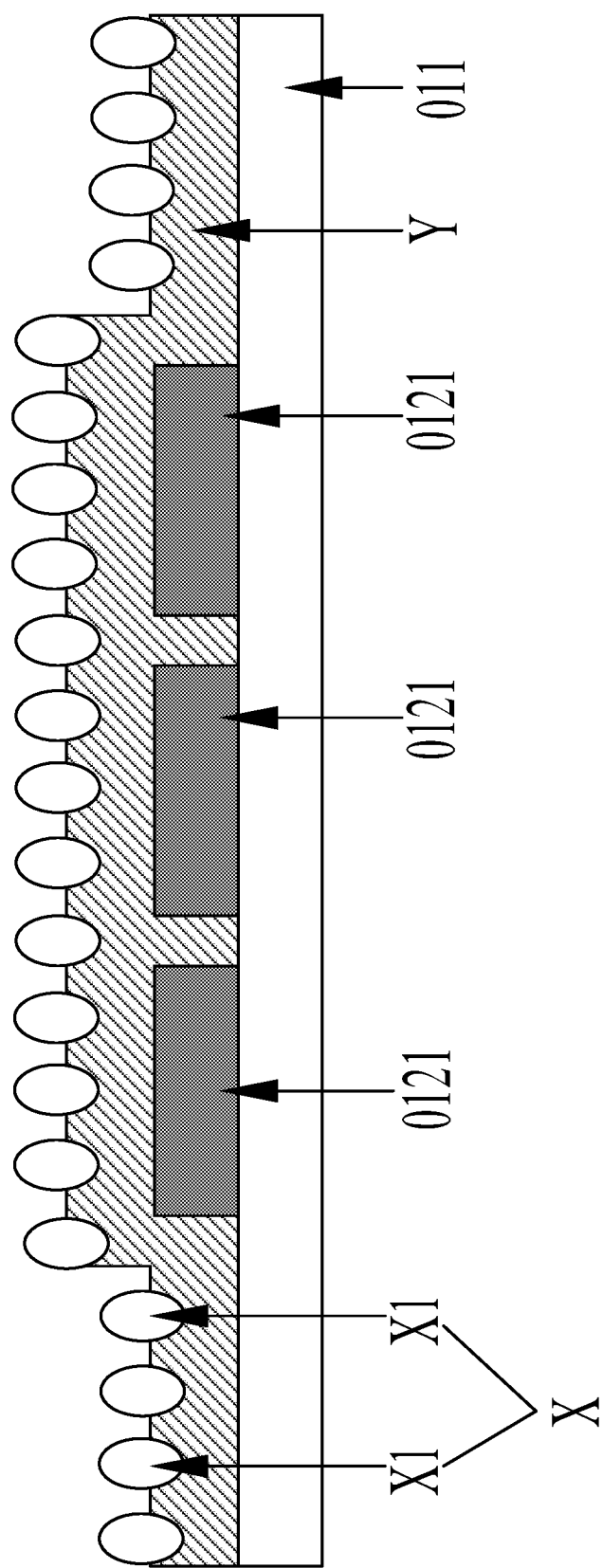
FIG. 11 is a schematic diagram showing a base substrate, on which a polystyrene monolayer film has been formed, after being provided with with a poly(3,4-ethylenedioxythiophene) poly(styrene sulfonic acid) layer thereon according to some embodiments of the present disclosure.

A reference will be made to FIG. 11, which illustrates a schematic diagram showing the base substrate 011, on which the polystyrene monolayer film X has been formed, after being further provided with a poly(3,4-ethylenedioxythiophene):poly(styrenesulfonate) layer Y thereon according to some embodiments of the present disclosure, and the polystyrene spheres X1 float on the surface of the poly(3,4-ethylenedioxythiophene):poly(styrenesulfonate) layer. Here, the thickness of the poly(3,4-ethylenedioxythiophene):poly(styrenesulfonate) layer Y is in a range of 10 to 50 nm; and a layer of poly(3,4-ethylenedioxythiophene): poly(styrenesulfonate) having a thickness of 10 to 50 nm may be coated on the base substrate 011 on which the polystyrene monolayer film X has been formed, by a coating process, to obtain the poly(3,4-ethylenedioxythiophene):poly(styrenesulfonate) layer Y. In the process of coating the poly(3,4-ethylenedioxythiophene):poly(styrenesulfonate), the wettability between the polystyrene monolayer film X and an anode 0121 can be controlled, and during actual implementation, the surfaces of the anode 0121 can be treated by a surface treatment technology to change a contact angle of the anode 0121, thereby controlling the wettability between the polystyrene monolayer film X and the anode 0121. It will be readily understood by persons of ordinary skill in the art that the poly(3,4-ethylenedioxythiophene polystyrenesulfonate) is in a liquid state; in the process of coating the poly(3,4-ethylenedioxythiophene):poly(styrenesulfonate) on the base substrate 011 on which the polystyrene monolayer film X has been formed, the poly(3,4-ethylenedioxythiophene):poly(styrenesulfonate) passes through gaps among the polystyrene spheres X1 and reach below the polystyrene monolayer film X, and is formed on the anodes 0121 as well as the non-display region of the base substrate 011; and since the density of the polystyrene spheres X1 is lower than the density of the poly(3,4-ethylenedioxythiophene):poly(styrenesulfonate), the polystyrene spheres X1 will float on the surface of the poly(3,4-ethylenedioxythiophene polystyrenesulfonate) layer Y.

In Sub-step 5043, the poly(3,4-ethylenedioxythiophene):poly(styrenesulfonate) layer is dried.

In some embodiments, a drying device may be used to dry the poly(3,4-ethylenedioxythiophene):poly(styrenesulfonate) layer. For example, a drying machine is used to bake the poly(3,4-ethylenedioxythiophene):poly(styrenesulfonate) layer to dry the poly(3,4-ethylenedioxythiophene):poly(styrenesulfonate) layer.

In Sub-step 5044, the surface of the dried poly(3,4-ethylenedioxythiophene):poly(styrenesulfonate) layer is washed to remove the polystyrene spheres on the surface of the poly(3,4-ethylenedioxythiophene):poly(styrenesulfonate) layer, forming a plurality of nano-grooves on a surface of the poly(3,4-ethylenedioxythiophene):poly(styrenesulfonate) layer away from the anode.

Figure 12:
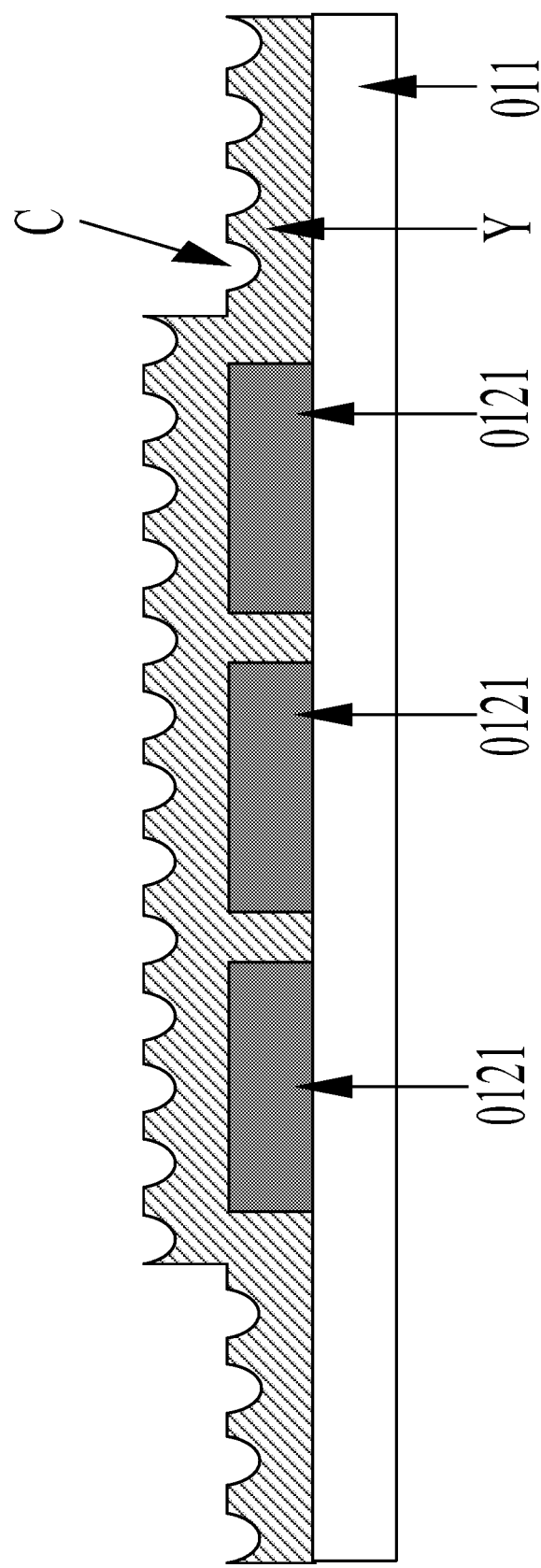
FIG. 12 is a schematic diagram showing a dried poly(3, 4-ethylenedioxythiophene) poly(styrene sulfonic acid) layer after being treated with a surface washing according to some embodiments of the present disclosure.

A reference will be made to FIG. 12, which illustrates a schematic diagram showing the dried poly(3,4-ethylenedioxythiophene):poly(styrenesulfonate) layer Y after surface thereof being washed according to some embodiments of the present disclosure. After the dried poly(3,4-ethylenedioxythiophene):poly(styrenesulfonate) layer Y is washed, the polystyrene spheres X1 floating on the surface of the poly(3,4-ethylenedioxythiophene):poly(styrenesulfonate) layer Y are removed, and a plurality of nano-grooves C are formed on the surface of the poly(3,4-ethylenedioxythiophene):poly(styrenesulfonate) layer Y, with a distance between any two adjacent nano-grooves C of the plurality of nano-grooves C being on a nanometric order of magnitude. In some embodiments, toluene may be used to wash the surface of the dried poly(3,4-ethylenedioxythiophene):poly(styrenesulfonate) layer to remove the polystyrene spheres X1.

In Sub-step 5045, the washed poly(3,4-ethylenedioxythiophene):poly(styrenesulfonate) layer is treated with a primary patterning process to obtain the hole transporting layer and the display stress releasing layer.

A reference will be made to FIG. 7, which illustrates a schematic diagram showing a washed poly(3,4-ethylenedioxythiophene):poly(styrenesulfonate) layer Y after being treated by the primary patterning process. Referring to FIG. 7, each anode 0121 has one hole transporting layer 0122, and the non-display region Q2 of the base substrate 011 has a display stress releasing layer 013.

In step 505, electroluminescent layers, electron transporting layers, and cathodes are formed sequentially on the hole transporting layers, and a thin film transistors, an anode, a hole transporting layer, a electroluminescent layer, an electron transporting layer and a cathode constitute a display unit.

Here, forming the electroluminescent layers 0123, the electron transporting layers 0124 and the cathodes 0125 on the hole transporting layers 0122 sequentially may include: forming the electroluminescent layers 0123 on the hole transporting layers 0122, forming the electron transporting layers 0124 on the electroluminescent layers 0123, and forming the cathodes 0125 on the electron transporting layers 0124.

Figure 13:
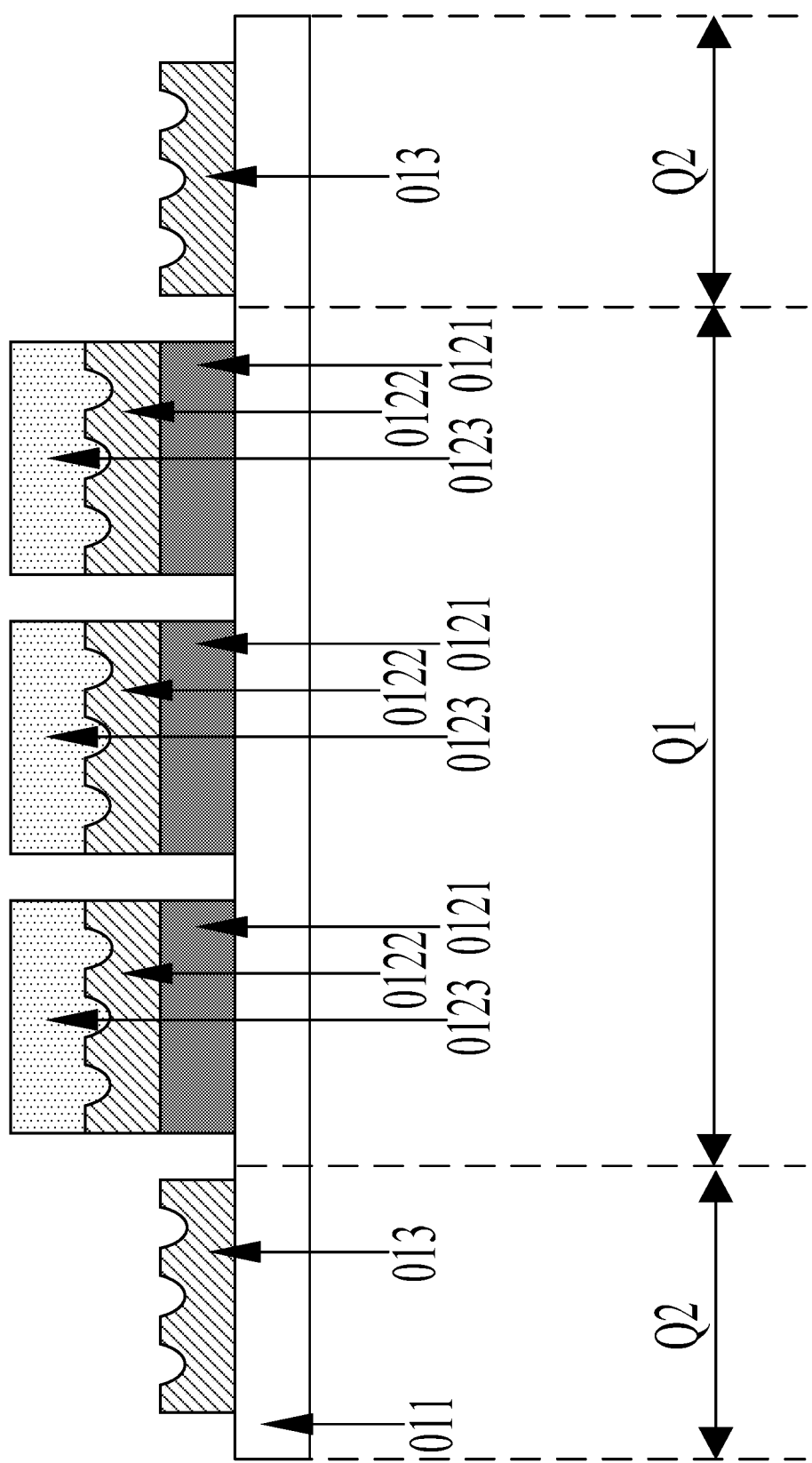
FIG. 13 is a schematic diagram showing hole transporting layers with electroluminescent layers formed thereon according to some embodiments of the present disclosure.

A reference will be made to FIG. 13, which illustrates a schematic diagram showing hole transporting layers 0121 on which electroluminescent layers 0123 have been formed according to some embodiments of the present disclosure. Each hole transporting layer 0121 has one electroluminescent layer 0123 located thereon, and the material of which may be an electroluminescent material. In some embodiments, a layer of electroluminescent material may be deposited on the base substrate 011 on which the hole transporting layer 0122 has been formed, by any one of processes such as magnetron sputtering, thermal evaporation, or PECVD to obtain a luminescent material layer; and then the luminescent material layer is treated by a primary patterning process to form an electroluminescent layer 0123 on each of the hole transporting layers 0122.

Figure 14:
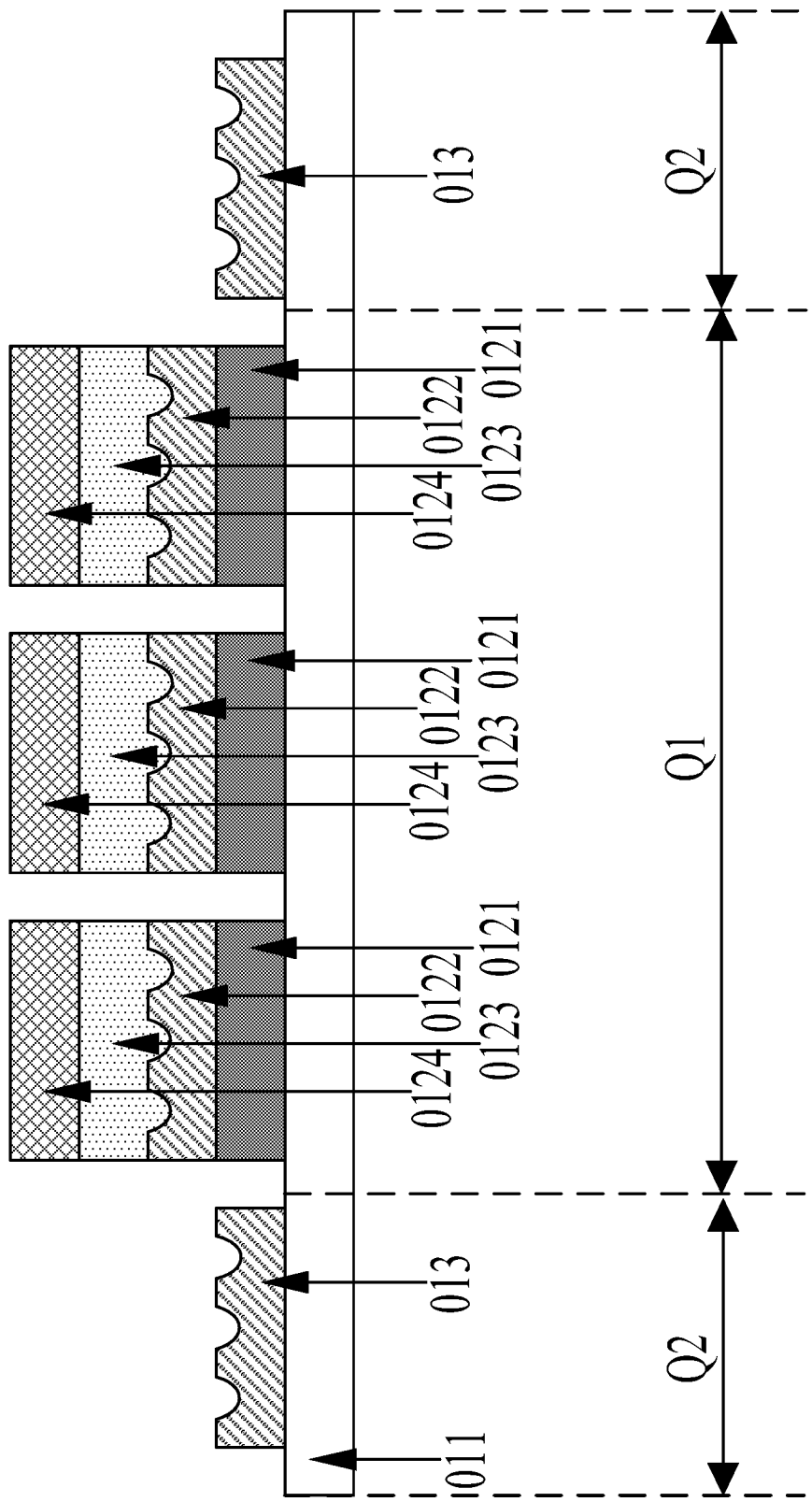
FIG. 14 is a schematic diagram showing electroluminescent layers with electron transporting layers formed thereon according to some embodiments of the present disclosure.

A reference will be made to FIG. 14, which illustrates a schematic diagram showing electroluminescent layers 0123 with electron transporting layers 0124 formed thereon according to some embodiments of the present disclosure, wherein the electron transporting layer 0124 may be made from a material of 8-hydroxyquinoline aluminum. In some embodiments, a layer of 8-hydroxyquinoline aluminum may be deposited on the substrate 011 on which the electroluminescent layer 0123 has been formed, by any of processes such as magnetron sputtering, thermal evaporation, or PECVD to obtain an 8-hydroxyquinoline aluminum material layer; and then the 8-hydroxyquinoline aluminum material layer is treated by the primary patterning process to form an electron transporting layer 0124 on each of the electroluminescent layers 0123.

In some embodiments of the present disclosure, a reference can be made to FIG. 3 for a schematic diagram showing the electron transporting layers 0124 with the cathodes 0125 formed thereon. Referring to FIG. 3, each electron transporting layer 0124 has one cathode 0125, and the material of the cathodes 0125 may be transparent semiconductor oxides such as ITO or IZO. After the cathodes 0125 are formed on the electron transporting layers 0124, each anode 0121 and one thin film transistor, together with the hole transporting layer 0122, the electroluminescent layer 0123, the electron transporting layer 0124 and the cathode 0125 superposed on the anode 0121 in sequence, constitute one display unit 012, thereby obtaining the display substrate 01. By way of example, a layer of ITO may be deposited on the base substrate 011 on which the electron transporting layer 0124 has been formed, by any one of processes such as magnetron sputtering, thermal evaporation, or PECVD to obtain an ITO material layer; and then the ITO material layer is treated by the primary patterning process to form one cathode 0125 on each of the electron transporting layers 0124.

It will be readily understood by persons of ordinary skill in the art that the embodiments of the present disclosure are described, by way of example, as follows: nano-grooves are disposed on the surface of each hole transporting layer 0122 that is in contact with the corresponding electroluminescent layer 0123, and are not disposed on the surface of the electron transporting layers 0124 that is in contact with the corresponding electroluminescent layer 0123. If the nano-grooves are required to be disposed on the surface of each electron transporting layer 0124 that is in contact with the corresponding electroluminescent layer 0123, the surface of the electroluminescent layer 0123 away from the hole transporting layer 0122 can be treated after the electroluminescent layer 0123 has been formed, in order to form nano-protrusions on the surface of the electroluminescent layer 0123 away from the hole transporting layer 0122, and then the electron transporting layer 0124 is formed, so that the surface of the electron transporting layer 0124 in contact with the electroluminescent layer 0123 would have the nano-grooves. The details are not repeated in the embodiments of the present disclosure.

It will be readily understood by persons of ordinary skill in the art that the display substrate may further include a package structure. After the plurality of display units 012 have been formed on the base substrate 011, the package structure can be further formed on the base substrate 011 on which the display unit 012 has been formed. The package structure may be a thin film package structure formed by alternately stacked inorganic layers and organic layers.

It will be readily understood by persons of ordinary skill in the art that in Step 504 above, after the poly(3,4-ethylenedioxythiophene):poly(styrenesulfonate) layer Y is formed on the base substrate 011 on which the polystyrene monolayer film X has been formed, the polystyrene in the polystyrene monolayer film X may be doped in the poly(3,4-ethylenedioxythiophene):poly(styrenesulfonate) layer Y, and may be located on the surface of the poly(3,4-ethylenedioxythiophene):poly(styrenesulfonate) layer Y. After the surface of the poly(3,4-ethylenedioxythiophene):poly(styrenesulfonate) layer Y is dried and then washed, the polystyrene doped in the poly(3,4-ethylenedioxythiophene):poly(styrenesulfonate) layer Y is located on the surface of the poly(3,4-ethylenedioxythiophene):poly(styrenesulfonate) layer Y, so that the polystyrene is present on the surface of the finally formed hole transporting layers 0122. This polystyrene may protect the poly(styrenesulfonate) in the hole transporting layers 0122, preventing the electroluminescent layers 0123 from being in direct contact with the poly(styrenesulfonate); the polystyrene on the surface of the hole transporting layers 0122 interacts with the poly(styrenesulfonate) in the hole transporting layers 0122 to increase the work function of the hole transporting layers 0122, making the work function of the hole transporting layers 0122 closer to the work function of the electroluminescent layer 0123 and the valence band of the hole transporting layers 0122 more matched with the valence band of the electroluminescent layer 0123, and reducing the interfacial potential barriers between the hole transporting layers 0122 and the electroluminescent layers 0123; and the hole transporting efficiency of the hole transporting layers 0122 can be increased by 2.5 times, thereby improving the luminescent efficiency of the electroluminescent layer 0123.

In some embodiments of the present disclosure, the primary patterning process may include: photoresist coating, exposing, developing, etching, and photoresist stripping. Therefore, treating the material layer (for example, the ITO material layer) by the primary patterning process to obtain a corresponding structure may include: first, coating a layer of photoresist on a material layer (for example, the ITO material layer) to form a photoresist layer; then exposing the photoresist layer with a mask to form a completely exposed region and a non-exposed region from the photoresist layer; next, treating the photoresist layer by a developing process, so that the photoresist in the completely exposed region is completely removed, and the photoresist in the non-exposed region is completely retained; afterwards, etching a region corresponding to the completely exposed region on the material layer (for example, the ITO material layer) by an etching process; and finally, stripping the photoresist in the non-exposed region, forming a corresponding structure (for example, the anode 0121) in the region corresponding to the non-exposed region on the material layer (for example, the ITO material layer). It will be readily understood by persons of ordinary skill in the art that in the embodiments of the present disclosure, the primary patterning process is explained by taking a positive photoresist as an example. During practical application, a negative photoresist may also be used for the primary patterning process, the details of which are not repeated in the embodiments of the present disclosure.

In summary, in the methods for manufacturing the display substrates provided by some embodiments of the present disclosure, since a plurality of nano-grooves are disposed on a surface of at least one of the hole transporting layer and the electron transporting layer, the surface is in contact with the electroluminescent layer, and a distance between any two adjacent nano-grooves is on a nanometric order of magnitude, more but smaller nano-grooves are present on the at least one of the hole transporting layer and the electron transporting layer, which can increase the contact area between the at least one of the hole transporting layer and the electron transporting layer and the electroluminescent layer, so that the at least one of the hole transporting layer and the electron transporting layer may absorb and release the stresses of the electroluminescent layers to a greater extent, contributing to the improvement of the capability of the display units in resisting bending, and preventing the display units from being ruptured due to the bending process.

It will be readily understood by those killed in the art that the sequential order of the steps of the methods for manufacturing the display substrates according to the embodiments of the present disclosure can be adjusted properly, and the steps may also be added or deleted accordingly as required. Any variations to the methods readily conceivable to any person skilled in the art based on the technical scope disclosed by the present disclosure shall fall within the protection scope of the present disclosure. Therefore, the detailed descriptions are not repeated here.

In some embodiments of the present disclosure, a display panel, which may be an electroluminescent display panel, is provided. For example, the display panel may be an OLED display panel or a quantum dot light emitting diodes (QLED for short) display panel. The display panel may include a display substrate, which may be the display substrate 01 shown in FIG. 1 or FIG. 3.

Figure 15:
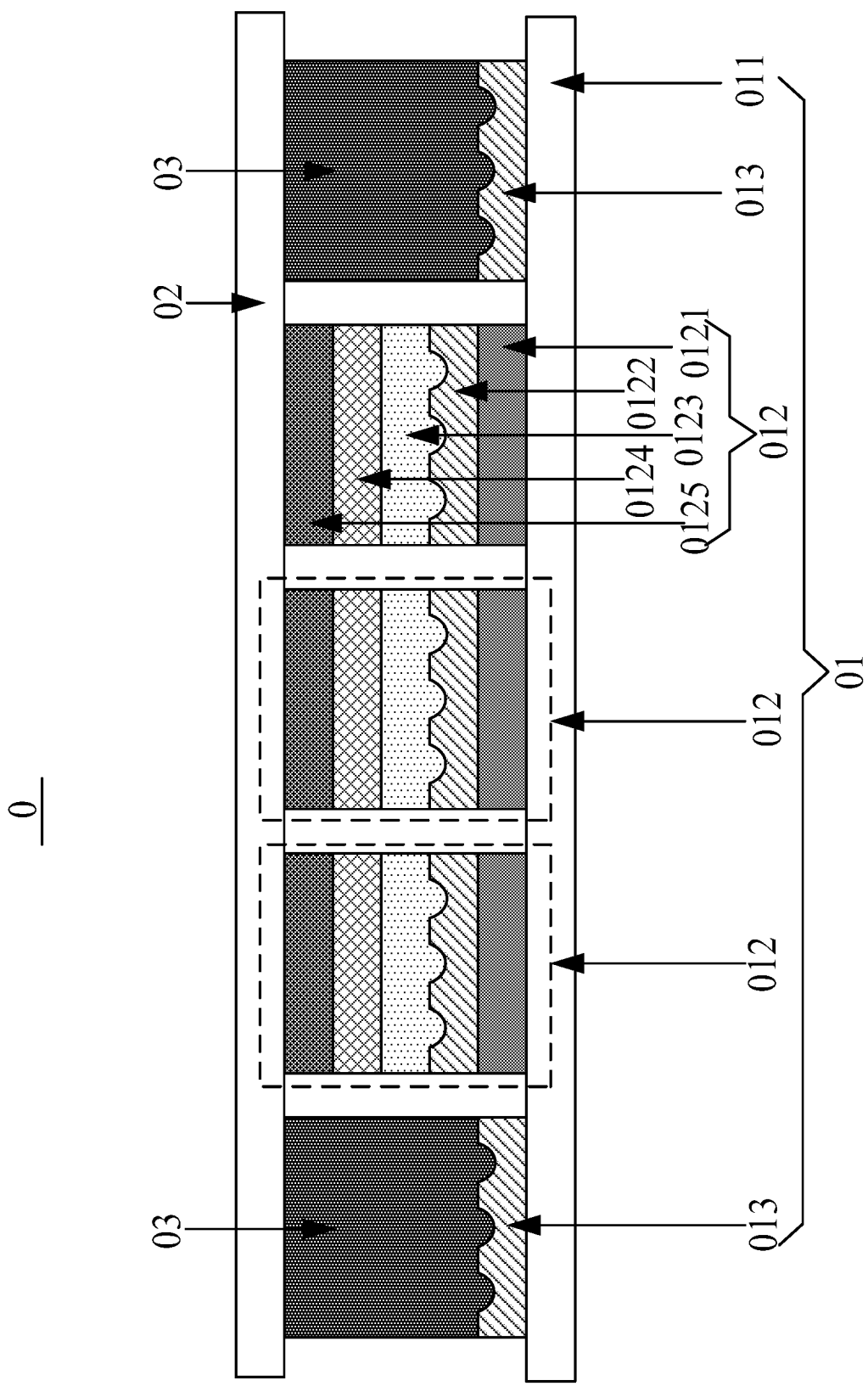
FIG. 15 is a schematic structural diagram of a display panel according to some embodiments of the present disclosure.

By way of example, a reference will be made to FIG. 15, which illustrates a schematic structural diagram of a display panel 0 according to some embodiments of the present disclosure. Referring to FIG. 15, the display panel 0 includes a display substrate 01 and a package substrate 02, which are disposed in an opposite position; the display substrate 01 is the display substrate shown in FIG. 3; the display unit 012 and the display stress releasing layer 013 of the display substrate 01 are both located between the base substrate 011 and the package substrate 02 of the display substrate 01; and the display substrate 01 and the package substrate 02 are bonded with the glass cement 03 in the non-display region (not marked out in FIG. 15) of the display substrate 01. As shown in FIG. 15, the glass cement 03 is located on the display stress releasing layer 013 of the display substrate 01. Since the display stress releasing layer 013 has a plurality of nano-grooves, with the distance between any two adjacent nano-grooves on the stress releasing layer 013 being on a nanometric order of magnitude, the display stress releasing layer 013 has a larger contact area with the glass cement 03, which can increase the contact area between the base substrate 011 and the glass cement 03, and improve the capability in resisting bending of the structures such as the gate lines and the data lines in the non-display region of the display panel 0.

Here, the base substrate 02 may be a transparent substrate, which may be a rigid substrate made from a light-guiding non-metallic material with a robustness, such as glass, quartz or transparent resin. Alternatively, the base substrate 02 may be a flexible substrate made from PI. When the base substrate 011 and the package substrate 02 are both flexible substrates, the display panel 0 is a flexible display panel.

In some embodiments, a reference will be made to FIG. 16, which illustrates a schematic structural diagram of another display panel 0 according to some embodiments of the present disclosure. On the basis of FIG. 15, the display panel 0 further includes: a package stress releasing layer 04 in a non-display region (not marked out in FIG. 16) of the package substrate 02. The package stress releasing layer 04 is located between the display substrate 01 and the package substrate 02, and is made from a material of poly(3,4-ethylenedioxythiophene):poly(styrenesulfonate). The package stress releasing layer 04 has a plurality of nano-grooves (not marked out in FIG. 16) on a surface that is away from the package substrate 02; and a distance between any two adjacent nano-grooves on the package stress releasing layer 04 is on a nanometric order of magnitude. Here, the package stress releasing layer 04 and the display stress releasing layer 013 may have the same structure, and the glass cement 03 is located between the package stress releasing layer 04 and the display stress releasing layer 013. Since both the package stress releasing layer 04 and the display stress releasing layer 013 have the nano-grooves, a large contact area is present both between the package stress releasing layer 04 and the glass cement 03 and between the display stress releasing layer 013 and the glass cement 03; and the display stress releasing layer 013 and the package stress releasing layer 04 can increase the contact area between either the base substrate 011 or the package substrate 04 and the glass cement 03, thereby improving the capability in resisting bending of structures such as the gate lines and the data lines of the non-display region of the display panel 0.

It will be readily understood by persons of ordinary skill in the art that in the display panel 0 according to some embodiments of the present disclosure, the surfaces of both the display stress releasing layer 013 and the package stress releasing layer 04 have a plurality of nano-grooves, which are arranged uniformly and densely to form a nano-scale microstructure. Compared with a micro-scale structure, the stress releasing layers (including the display stress releasing layer 013 and the package stress releasing layer 04) have a larger contact area with the base substrate 011, the glass cement 03, and the package substrate 02, and may absorb and release the interfacial stress of the structures in contact with the stress releasing layers to a greater extent, making the display panel 0 firmer and more flexible. In particular, the mechanical stability of the display panel 0 can be ensured during the usage upon repeated bending. The display panel 0 according to some embodiments of the present disclosure is more advantageous when applied to the products that are bent at a small radius of curvature.

In summary, in the display panel provided by some embodiments of the present disclosure, since a plurality of nano-grooves are disposed on a surface of at least one of the hole transporting layer and the electron transporting layer, the surface is in contact with the electroluminescent layer, and a distance between any two adjacent nano-grooves is on a nanometric order of magnitude, more and smaller nano-grooves are present on the at least one of the hole transporting layer and the electron transporting layer, which can increase the contact area between the at least one of the hole transporting layer and the electron transporting layer and the electroluminescent layer, so that the at least one of the hole transporting layer and the electron transporting layer may absorb and release the stresses of the electroluminescent layers to a greater extent, contributing to the improvement of the capability of the display units in resisting bending, and preventing the display units from being ruptured due to the bending process. Furthermore, the non-display region of the display panel is provided with the display stress releasing layer and the package stress releasing layer, the surface of the display stress releasing layer away from the base substrate and the surface of the package stress releasing layer away from the package substrate both have a plurality of nano-grooves, and the distance between any two adjacent nano-grooves is on a nanometric order of magnitude; therefore, the nano-grooves on the display stress releasing layer can increase the contact area between the display stress releasing layer and the glass cement, the nano-grooves on the package stress releasing layer can increase the contact area between the package stress releasing layer and the glass cement, contributing to the improvement of the capability in resisting bending of the structures such as the gate lines and the data lines in the non-display region, and preventing the gate lines and the data lines from being ruptured in a bending process.

The display panel provided by some embodiments of the present disclosure can be applied to the method below, and for the method and principle for manufacturing the display panel in some embodiments of the present disclosure, the description in the respective embodiments below can be referred to.

A reference will be made to FIG. 17, which illustrates a flowchart of a method for manufacturing a display panel according to some embodiments of the present disclosure. The method for manufacturing the display panel can be used to manufacture the display panel 0 shown in FIG. 15 or FIG. 16. These embodiments will be described by taking the display panel 0 shown in FIG. 16 as an example. Referring to FIG. 17, the method may include the following steps.

In Step 601, a display substrate is formed.

Moreover, the display substrate may be the display substrate 01 shown in FIG. 1 or 3. For a process of forming the display substrate 01, a reference may be made to some embodiments shown in FIG. 4 or 5, and the details will not be repeated here in this embodiment.

In step 602, a package stress releasing layer is formed in a non-display region of a package substrate, wherein the package stress releasing layer has a plurality of nano-grooves on a surface away from the package substrate, and a distance between any two adjacent nano-grooves on the package stress releasing layer is on a nanometric order of magnitude.

Figure 18:
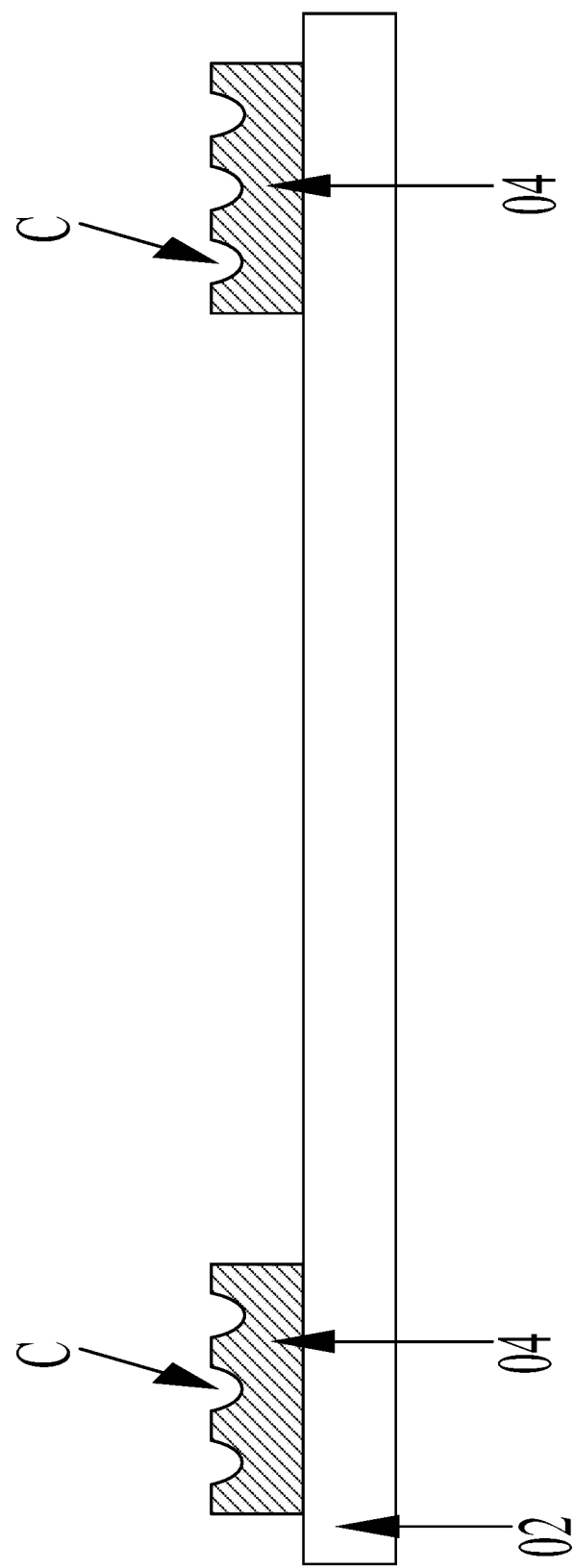
FIG. 18 is a schematic diagram showing a package substrate with a package stress releasing layer formed thereon according to some embodiments of the present disclosure.

A reference will be made to FIG. 18, which illustrates a schematic diagram showing a package stress releasing layer 04 formed in a non-display region of a package substrate 02, wherein the package stress releasing layer 04 have a plurality of nano-grooves C on a surface away from the package substrate 02, and a distance between any two adjacent nano-grooves C on the package stress releasing layer 04 is on a nanometric order of magnitude. Here, the package stress releasing layer 04 may be made from a material of poly(3,4-ethylenedioxythiophene): poly(styrenesulfonate).

In some embodiments, forming the package stress releasing layer 04 in the non-display region of the package substrate 02 may include: forming a polystyrene monolayer film on the package substrate 02, wherein the polystyrene monolayer film includes a plurality of polystyrene spheres, and a distance between any two adjacent polystyrene spheres of the plurality of polystyrene spheres is on a nanometric order of magnitude; forming a poly(3,4-ethylenedioxythiophene):poly(styrenesulfonate) layer on the package substrate 02 on which the polystyrene monolayer film has been formed, so that the polystyrene spheres in the polystyrene monolayer film float on the surface of the poly(3,4-ethylenedioxythiophene):poly(styrenesulfonate) layer; drying the poly(3,4-ethylenedioxythiophene):poly (styrenesulfonate) layer; then, washing the surface of the dried poly(3,4-ethylenedioxythiophene):poly(styrenesulfonate) layer with toluene to remove the polystyrene spheres on the surface of the poly(3,4-ethylenedioxythiophene):poly(styrenesulfonate) layer, and form a plurality of nano-grooves on the surface of the poly(3,4-ethylenedioxythiophene):poly(styrenesulfonate) layer; and finally, treating the washed poly(3,4-ethylenedioxythiophene):poly(styrenesulfonate) layer by a primary patterning process to form a package stress releasing layer 04 in the non-display region of the package substrate 02.

In Step 603, the display substrate and the package substrate are arranged opposite to each other, so that the package stress releasing layer is located between the display substrate and the package substrate.

In Step 603, the display substrate 01 shown in FIG. 3 is taken as an example for illustrating the display substrate. When the display substrate 01 and the package substrate 02 are arranged opposite to each other, the display panel 0 shown in FIG. 16 can be obtained.

In some embodiments, the glass cement may be coated on the display stress releasing layer 013 and/or the package stress releasing layer 04; then the display substrate 01 is located opposite to the package substrate 02; a pressure is applied to the display substrate 01 and/or the package substrate 02; and then, the glass cement is sintered, so that the display substrate 01 and the package substrate 02 are adhered by the glass cement 03 to form the display panel 0.

In summary, in the methods for manufacturing the display panels provided by some embodiments of the present disclosure, since a plurality of nano-grooves are disposed on a surface of at least one of the hole transporting layer and the electron transporting layer, the surface is in contact with the electroluminescent layer, and a distance between any two adjacent nano-grooves is on a nanometric order of magnitude, more and smaller nano-grooves are present on the at least one of the hole transporting layer and the electron transporting layer, which can increase the contact area between the at least one of the hole transporting layer and the electron transporting layer and the electroluminescent layer, so that the at least one of the hole transporting layer and the electron transporting layer may absorb and release the stresses of the electroluminescent layers to a greater extent, contributing to the improvement of the capability in resisting bending of the display units, and preventing the display units from being ruptured due to the bending process. Furthermore, the non-display region of the display panel is provided with the display stress releasing layer and the package stress releasing layer, the surface of the display stress releasing layer away from the base substrate and the surface of the package stress releasing layer away from the package substrate both have a plurality of nano-grooves, and the distance between any two adjacent nano-grooves is on a nanometric order of magnitude; therefore, the nano-grooves on the display stress releasing layer can increase the contact area between the display stress releasing layer and the glass cement, the nano-grooves on the package stress releasing layer can increase the contact area between the package stress releasing layer and the glass cement, contributing to the improvement of the capability of the structures such as the gate lines and the data lines in the non-display region in resisting bending, and preventing the gate lines and the data lines from being ruptured in a bending process.

Figure 16:
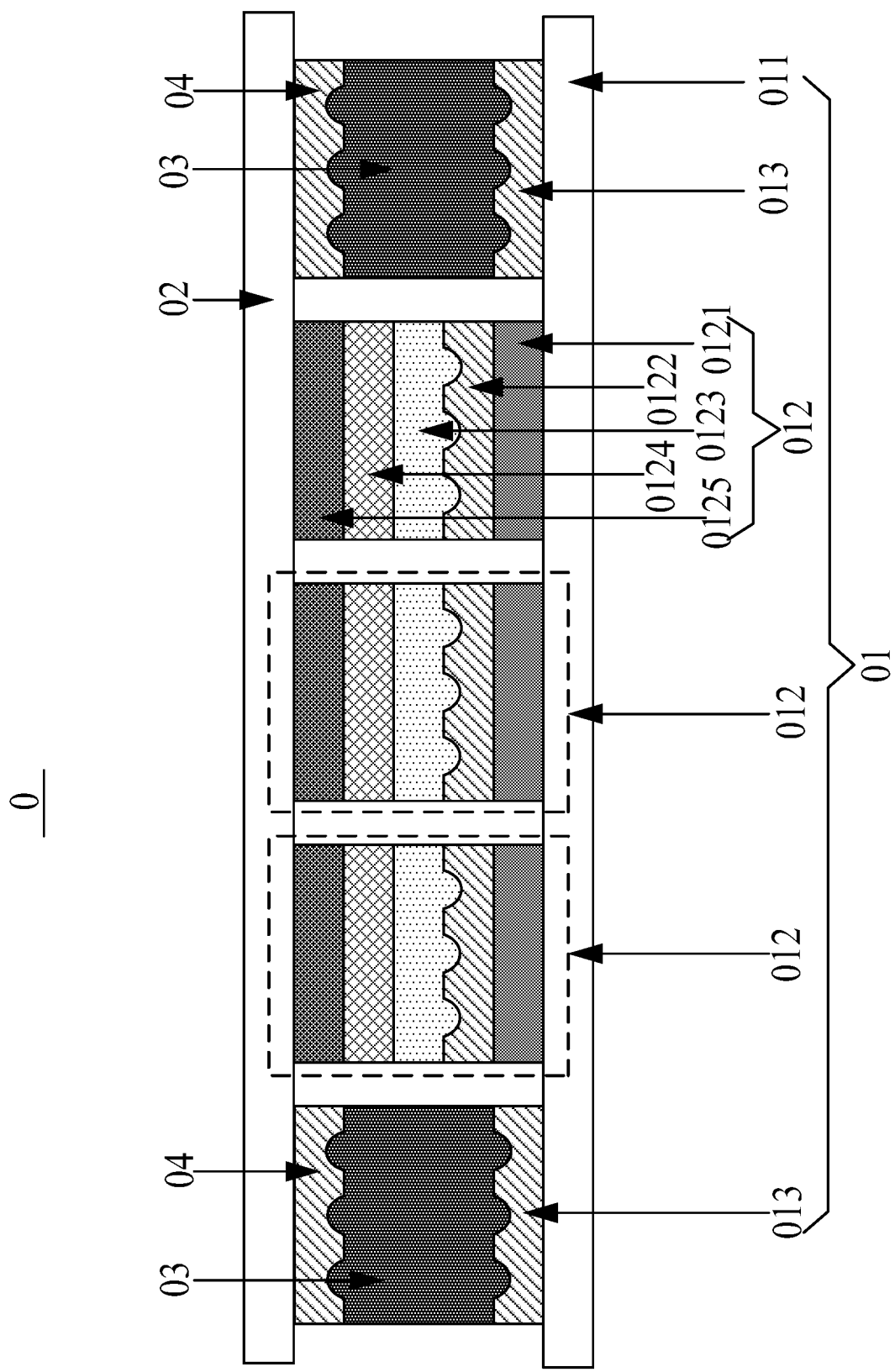
FIG. 16 is a schematic structural diagram of another display panel according to some embodiments of the present disclosure.
Figure 17:
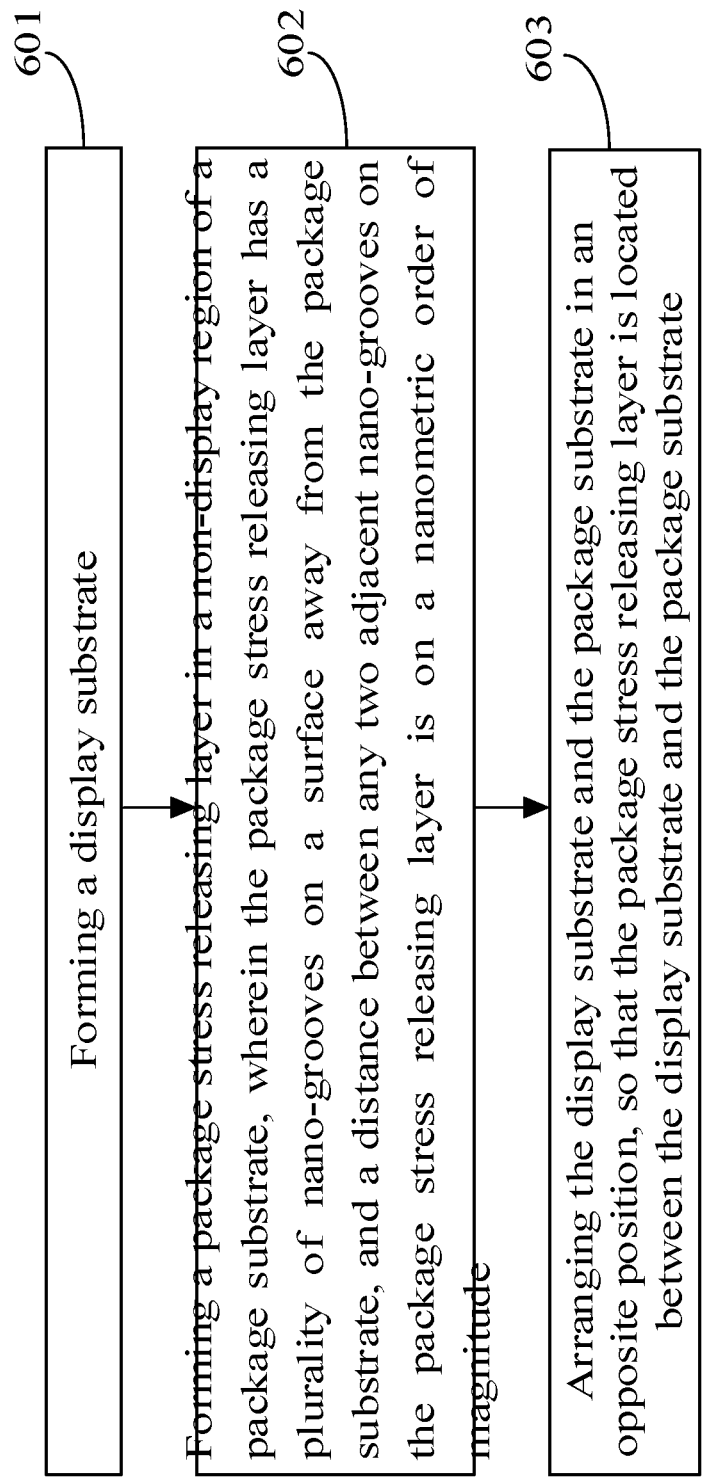
FIG. 17 is a flowchart of a method for manufacturing a display panel according to some embodiments of the present disclosure.

In some embodiments of the present disclosure, a display apparatus, which includes the display panel 0 shown in FIG. 15 or FIG. 16, is further provided. The display apparatus may be: electronic paper, a mobile phone, a tablet computer, a television, a display, a notebook computer, a digital photo frame, a navigator, a smart wearable device or any products or components that have a display function.

The term "plurality" herein refers to two or more. "And/or" herein describes the correspondence of the corresponding objects, indicating three kinds of relationship. For example, A and/or B, can be expressed as: A exists alone, A and B exist concurrently, B exists alone. The character "/" generally indicates that the context object is an "OR" relationship.

Persons of ordinary skill in the art can understand that all or part of the steps described in the above embodiments can be completed through hardware, or through relevant hardware instructed by applications stored in a non-transitory computer readable storage medium, such as a read-only memory, a disk or a CD, etc.

The foregoing descriptions are merely exemplary embodiments of the present disclosure, and are not intended to limit the present disclosure. Within the principles of the disclosure, any modifications, equivalent substitutions, improvements, etc., are within the protection scope of the present disclosure.

What is claimed is:

1. A display substrate, comprising:
   a base substrate, and display units on the base substrate, wherein each of the display units comprises: an anode, a hole transporting layer, an electroluminescent layer, an electron transporting layer and a cathode, all of which are superposed in sequence; a plurality of nano-grooves are disposed on a surface of the hole transporting layer, the surface is in contact with the electroluminescent layer, such that a contact area between the electroluminescent layer and the hole transporting layer is increased, wherein a distance between any two adjacent nano-grooves on the surface of the hole transporting layer is on a nanometric order of magnitude; and
   the display units are located in a display region of the base substrate, the base substrate further has a non-display region, and the display substrate further comprises: a display stress releasing layer located in the non-display region, wherein the display stress releasing layer has a plurality of nano-grooves on a surface that is away from the base substrate, such that a contact area between the display stress releasing layer and a glass cement is increased, wherein a distance between any two adjacent nano-grooves on the display stress releasing layer is on a nanometric order of magnitude, and a maximum thickness of the display stress releasing layer is equal to a maximum thickness of the hole transporting layer.

2. The display substrate according to claim 1, wherein the nano-grooves are hemispherical nano-grooves.

3. The display substrate according to claim 1, wherein the nano-grooves have a depth in a range of 3 to 40 nm, and the distance between any two adjacent nano-grooves is in a range of 5 to 50 nm.

4. The display substrate according to claim 1, wherein the plurality of the nano-grooves of the hole transporting layer are disposed on the surface, in contact with the electroluminescent layer, of the hole transporting layer, and the maximum thickness of the hole transporting layer is in a range of 10 to 50 nm.

5. The display substrate according to claim 1, wherein a material of both the display stress releasing layer and the hole transporting layer is poly(3,4-ethylenedioxythiophene)-poly(styrenesulfonate).

6. The display substrate according to claim 1, further comprising:
   a gate line and a data line on the base substrate,
   wherein the display units further comprise a plurality of thin film transistors, each of the plurality of thin film transistors comprises a gate, a source and a drain, the gate is electrically connected to the gate line, the source is electrically connected to the data line, and the drain is electrically connected to the anode.

7. A method for manufacturing a display substrate, comprising:
   providing a base substrate;
   forming display units, comprising:
      forming anodes on the base substrate;
      forming hole transporting layers on the base substrate on which the anodes have been formed, each of the hole transporting layers having a plurality of nano-grooves on a surface that is away from the anode, such that a contact area between the hole transporting layer and the electroluminescent layer is increased, wherein a distance between any two adjacent nano-grooves on the surface of each of the hole transporting layers being on a nanometric order of magnitude; and
      forming electroluminescent layers, electron transporting layers, and cathodes on the base substrate on which the hole transporting layers have been formed successively; and
   the display units are located in a display region of the base substrate, the base substrate further has a non-display region, and the method further comprises:
   forming a display stress releasing layer in the non-display region, the display stress releasing layer having a plurality of nano-grooves on a surface away from the base substrate, such that a contact area between the display stress releasing layer and a glass cement is increased, wherein a distance between any two adjacent nano-grooves on the display stress releasing layer is on a nanometric order of magnitude, and a maximum thickness of the display stress releasing layer is equal to a maximum thickness of the hole transporting layer.

8. The method according to claim 7, wherein the forming the hole transporting layers on the base substrate on which the anodes have been formed, each of the hole transporting layers having the plurality of nano-grooves on the surface that is away from the anode, and the distance between any two adjacent nano-grooves on each of the hole transporting layers being on a nanometric order of magnitude, comprises:
   forming a polystyrene monolayer film on the base substrate on which the anodes have been formed, the polystyrene monolayer film comprising a plurality of polystyrene spheres, and a distance between any two adjacent polystyrene spheres being on a nanometric order of magnitude;
   forming a poly(3,4-ethylenedioxythiophene):poly(styrenesulfonate) layer on the base substrate on which the polystyrene monolayer film has been formed, so that the polystyrene spheres in the polystyrene monolayer film float on a surface of the poly(3,4-ethylenedioxythiophene):poly(styrenesulfonate) layer;
   drying the poly(3,4-ethylenedioxythiophene):poly(styrenesulfonate) layer;
   washing the surface of the dried poly(3,4-ethylenedioxythiophene):poly(styrenesulfonate) layer to remove the polystyrene spheres on the surface of the poly(3,4-ethylenedioxythiophene):poly(styrenesulfonate) layer, thereby forming a plurality of nano-grooves on a surface of the poly(3,4-ethylenedioxythiophene):poly(styrenesulfonate) layer away from the anode; and
   treating the washed poly(3,4-ethylenedioxythiophene):poly(styrenesulfonate) layer with a primary patterning process to obtain the hole transporting layer.

9. The method according to claim 8, wherein the washing the surface of the dried poly(3,4-ethylenedioxythiophene): poly(styrenesulfonate) layer comprises:

washing the surface of the dried poly(3,4-ethylenedioxythiophene): poly(styrenesulfonate) layer with toluene.

10. The method according to claim 7, wherein the display stress releasing layer and the hole transporting layers are formed by the same primary process.

11. A display panel, comprising:

a display substrate and a package substrate located in an opposite position, wherein the display substrate comprises a base substrate and display units on the base substrate; each of the display units comprises: an anode, a hole transporting layer, an electroluminescent layer, an electron transporting layer and a cathode, all of which are superposed in sequence; a plurality of nano-grooves are disposed on a surface of the hole transporting layer, the surface is in contact with the electroluminescent layer, such that a contact area between the electroluminescent layer and the hole transporting layer is increased; wherein a distance between any two adjacent nano-grooves on the surface of the hole transporting layer is on a nanometric order of magnitude; and the display units are located in a display region of the base substrate, the base substrate further has a non-display region, and the display substrate further comprises: a display stress releasing layer located in the non-display region, wherein the display stress releasing layer has a plurality of nano-grooves on a surface that is away from the base substrate, such that a contact area between the display stress releasing layer and a glass cement is increased, wherein a distance between any two adjacent nano-grooves on the display stress releasing layer is on a nanometric order of magnitude, and a maximum thickness of the display stress releasing layer is equal to a maximum thickness of the hole transporting layer.

12. The display panel according to claim 11, wherein the nano-grooves are hemispherical nano-grooves.

13. The display panel according to claim 11, further comprising:

a gate line and a data line on the base substrate, wherein the display units further comprise thin film transistors, each of which comprises a gate, a source and a drain, the gate is electrically connected to the gate line, the source is electrically connected to the data line, and the drain is electrically connected to the anode.

14. The display panel according to claim 11, further comprising:

a package stress releasing layer in the non-display region of the package substrate, wherein the package stress releasing layer has a plurality of nano-grooves on a surface that is away from the package substrate;

a distance between any two adjacent nano-grooves on the package stress releasing layer is on a nanometric order of magnitude;

and the package stress releasing layer is located between the display substrate and the package substrate.

15. A display apparatus, comprising the display panel according to claim 11.

* * * * *